(12) United States Patent
Chen et al.

(10) Patent No.: US 11,532,507 B2
(45) Date of Patent: *Dec. 20, 2022

(54) SEMICONDUCTOR DEVICE AND METHOD

(71) Applicant: Taiwan Semiconductor Manufacturing Co., Ltd., Hsinchu (TW)

(72) Inventors: Chun-Han Chen, Changhua (TW); I-Wen Wu, Hsinchu (TW); Chen-Ming Lee, Yangmei (TW); Fu-Kai Yang, Hsinchu (TW); Mei-Yun Wang, Chu-Pei (TW); Chung-Ting Ko, Kaohsiung (TW); Jr-Hung Li, Chupei (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 38 days.

This patent is subject to a terminal disclaimer.

(21) Appl. No.: 17/169,989

(22) Filed: Feb. 8, 2021

(65) Prior Publication Data

US 2021/0183696 A1    Jun. 17, 2021

Related U.S. Application Data

(63) Continuation of application No. 16/429,461, filed on Jun. 3, 2019, now Pat. No. 10,943,818.

(Continued)

(51) Int. Cl.
*H01L 27/088* (2006.01)
*H01L 21/768* (2006.01)
(Continued)

(52) U.S. Cl.
CPC .... *H01L 21/76831* (2013.01); *H01L 21/0228* (2013.01); *H01L 21/02274* (2013.01);
(Continued)

(58) Field of Classification Search
CPC combination set(s) only.
See application file for complete search history.

(56) References Cited

U.S. PATENT DOCUMENTS 7,981,786 B2   7/2011   Joo et al.
8,722,546 B2   5/2014   Fukazawa et al.
(Continued)

FOREIGN PATENT DOCUMENTS

CN   106158931 A    11/2016
DE   102016118956 A1   9/2017
(Continued)

*Primary Examiner* — Niki H Nguyen
(74) *Attorney, Agent, or Firm* — Slater Matsil, LLP

(57) ABSTRACT

In an embodiment, a method includes: forming a differential contact etch stop layer (CESL) having a first portion over a source/drain region and a second portion along a gate stack, the source/drain region being in a substrate, the gate stack being over the substrate proximate the source/drain region, a first thickness of the first portion being greater than a second thickness of the second portion; depositing a first interlayer dielectric (ILD) over the differential CESL; forming a source/drain contact opening in the first ILD; forming a contact spacer along sidewalls of the source/drain contact opening; after forming the contact spacer, extending the source/drain contact opening through the differential CESL; and forming a first source/drain contact in the extended source/drain contact opening, the first source/drain contact physically and electrically coupling the source/drain region, the contact spacer physically separating the first source/drain contact from the first ILD.

20 Claims, 25 Drawing Sheets

Related U.S. Application Data

(60) Provisional application No. 62/753,359, filed on Oct. 31, 2018.

(51) Int. Cl.

| | | |
|---|---|---|
| *H01L 29/66* | (2006.01) | |
| *H01L 21/02* | (2006.01) | |
| *H01L 29/78* | (2006.01) | |
| *H01L 29/40* | (2006.01) | |
| *H01L 29/417* | (2006.01) | |
| *H01L 29/08* | (2006.01) | |

(52) U.S. Cl.
CPC .. *H01L 21/76802* (2013.01); *H01L 21/76832* (2013.01); *H01L 29/401* (2013.01); *H01L 29/41791* (2013.01); *H01L 29/6656* (2013.01); *H01L 29/66795* (2013.01); *H01L 29/785* (2013.01); *H01L 21/0217* (2013.01); *H01L 29/0847* (2013.01)

(56) References Cited

U.S. PATENT DOCUMENTS

| | | |
|---|---|---|
| 9,105,490 B2 | 8/2015 | Wang et al. |
| 9,190,489 B1 | 11/2015 | Mountsier et al. |
| 9,218,974 B2 | 12/2015 | Chung et al. |
| 9,236,267 B2 | 1/2016 | De et al. |
| 9,236,300 B2 | 1/2016 | Liaw |
| 9,397,003 B1 | 7/2016 | Niimi et al. |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,761,483 B1 | 9/2017 | Chang et al. |
| 9,831,183 B2 | 11/2017 | Lin et al. |
| 9,859,386 B2 | 1/2018 | Ho et al. |
| 10,522,359 B2 | 12/2019 | Huang et al. |
| 10,714,576 B2 | 7/2020 | Hung et al. |
| 10,923,573 B2 * | 2/2021 | Wang ................ H01L 29/4958 |
| 10,943,818 B2 * | 3/2021 | Chen ................ H01L 29/41791 |
| 2006/0189053 A1 | 8/2006 | Wang et al. |
| 2009/0032881 A1 | 2/2009 | Lee et al. |
| 2009/0246367 A1 | 10/2009 | Huotari et al. |
| 2010/0210108 A1 | 8/2010 | Ishizaka et al. |
| 2011/0198736 A1 | 8/2011 | Shero et al. |
| 2014/0035048 A1 | 2/2014 | Lee et al. |
| 2014/0045315 A1 | 2/2014 | Witters |
| 2014/0217517 A1 * | 8/2014 | Cai ................ H01L 29/785 438/586 |
| 2015/0037980 A1 | 2/2015 | Rha et al. |
| 2015/0364559 A1 | 12/2015 | Wang |
| 2015/0380558 A1 | 12/2015 | Huang |
| 2016/0005839 A1 | 1/2016 | Meh et al. |
| 2016/0020300 A1 | 1/2016 | Tsai et al. |
| 2016/0043035 A1 | 2/2016 | Lin et al. |
| 2016/0064275 A1 | 3/2016 | Liu et al. |
| 2016/0071799 A1 | 3/2016 | Hsieh et al. |
| 2016/0172189 A1 | 6/2016 | Tapily |
| 2016/0365426 A1 | 12/2016 | Ching et al. |
| 2017/0110536 A1 | 4/2017 | Hsiao et al. |
| 2017/0250068 A1 | 8/2017 | Ishikawa et al. |
| 2017/0338326 A1 | 11/2017 | Ching et al. |
| 2017/0358491 A1 | 12/2017 | Zhou et al. |
| 2018/0102280 A1 | 4/2018 | Nguyen et al. |
| 2018/0190653 A1 | 7/2018 | Lu et al. |
| 2018/0301371 A1 | 10/2018 | Wang et al. |
| 2019/0096888 A1 | 3/2019 | Ko et al. |
| 2019/0273023 A1 * | 9/2019 | Loh ................ H01L 21/823425 |
| 2020/0035679 A1 * | 1/2020 | Ko ................ H01L 29/66553 |

FOREIGN PATENT DOCUMENTS

| | | |
|---|---|---|
| KR | 20060007176 A | 1/2006 |
| KR | 20090012573 A | 2/2009 |
| KR | 20160028938 A | 3/2016 |
| KR | 20180079161 A | 7/2018 |
| KR | 20180117018 A | 10/2018 |
| TW | 200901392 A | 1/2009 |
| TW | 201432847 A | 8/2014 |
| TW | 201721755 A | 6/2017 |
| TW | 201820540 A | 6/2018 |
| WO | 2017048259 A1 | 3/2017 |

* cited by examiner

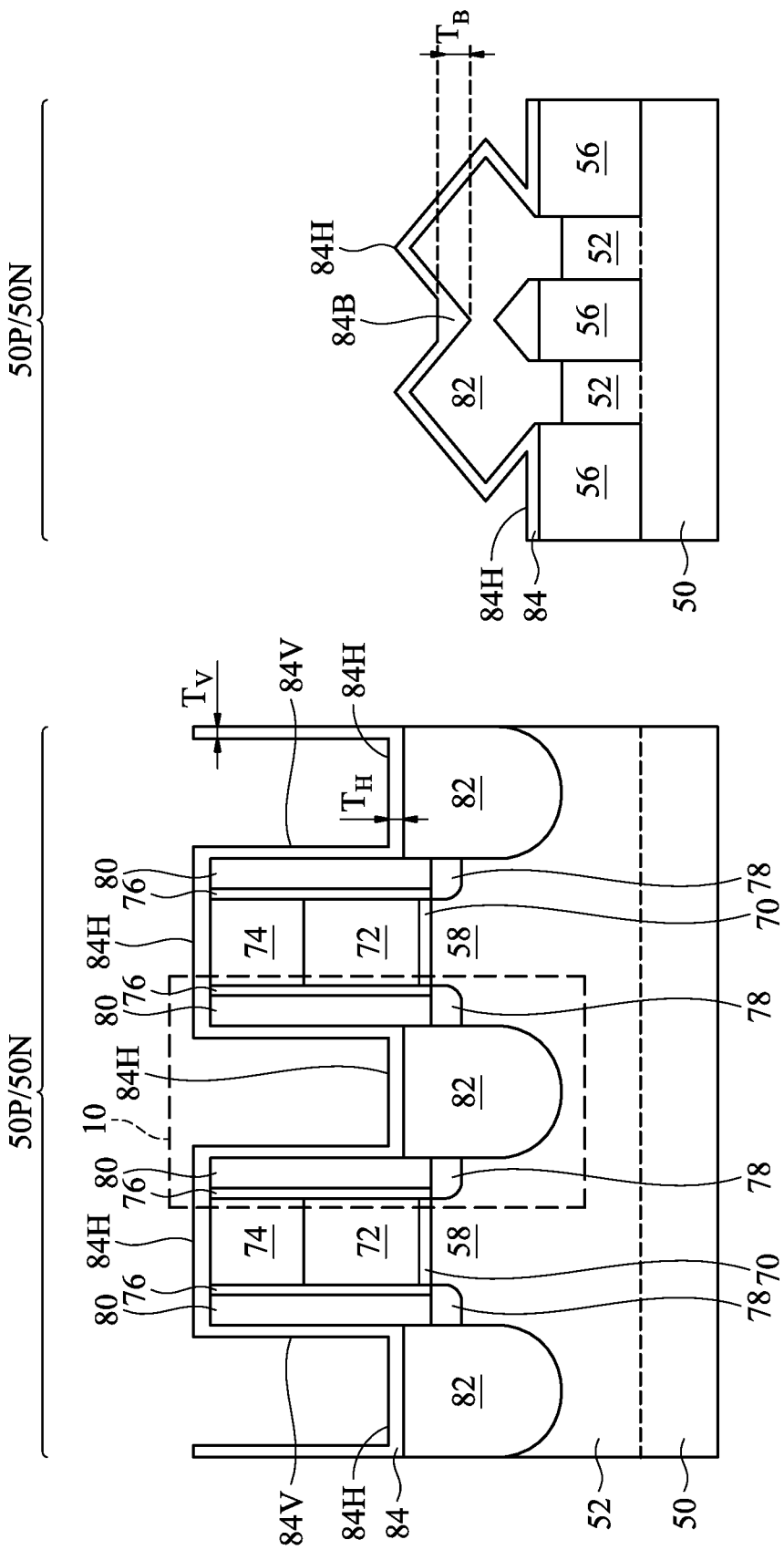

SEMICONDUCTOR DEVICE AND METHOD

PRIORITY CLAIM AND CROSS-REFERENCE

This application is a continuation of U.S. patent application Ser. No. 16/429,461 entitled, "Semiconductor Device and Method," filed on Jun. 3, 2019 which claims the benefit of U.S. Provisional Application No. 62/753,359, filed on Oct. 31, 2018, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10, 11, 12, and 13 are cross-sectional views of intermediate stages in the manufacturing of FinFETs, in accordance with some embodiments.

DETAILED DESCRIPTION

Figure 1:
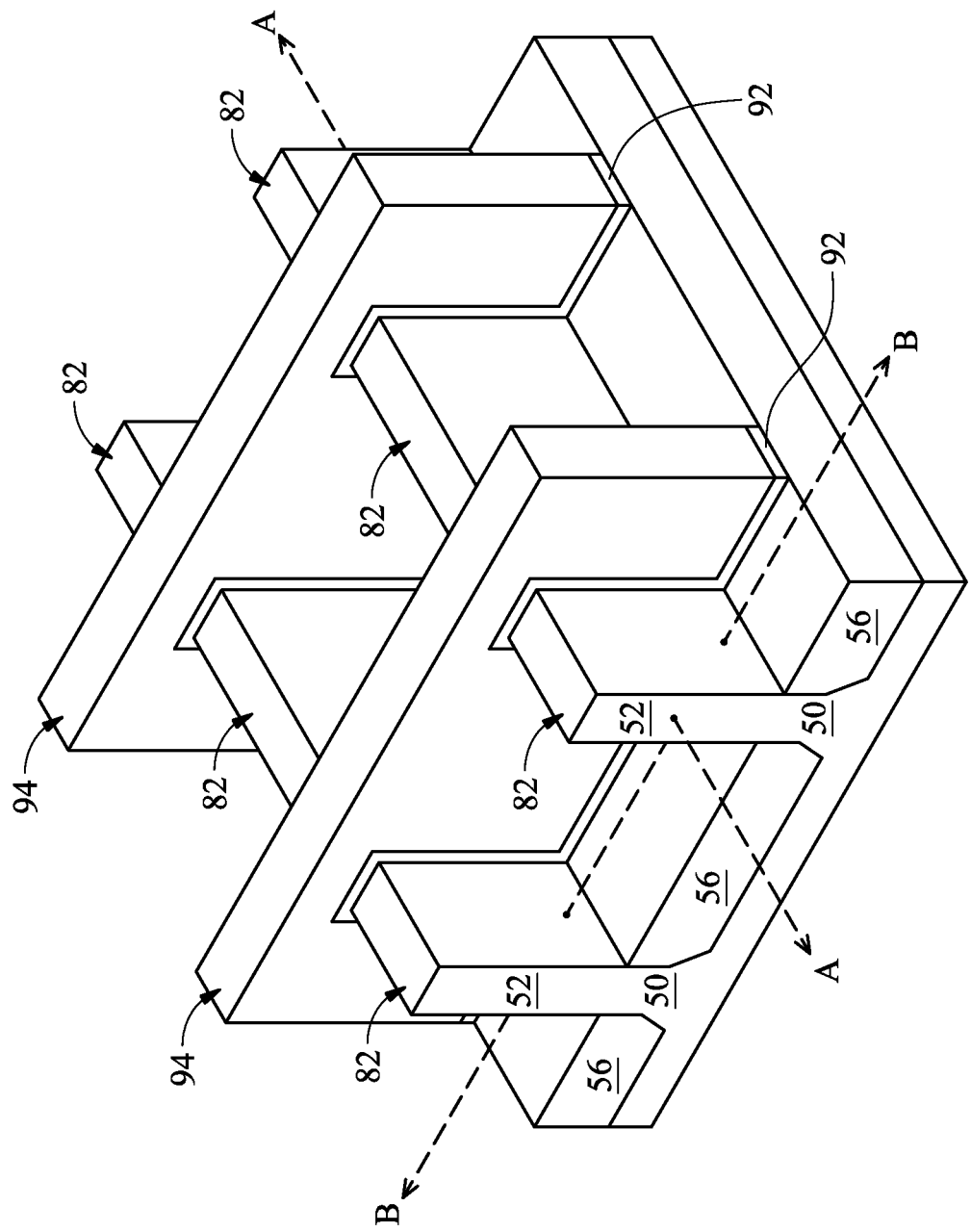
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a differential contact etch stop layer (CESL) is formed in a semiconductor device, such as a Fin Field-Effect Transistor (FinFET). Generally, a directional plasma activation process is implemented which permits some portions of the differential CESL (e.g., portions on an upper surface having a horizontal component) to be deposited at a greater rate than other portions (e.g., on a vertical surface without a significant horizontal component). Hence, some portions of the differential CESL have a greater thickness than other portions of the differential CESL. The differential CESL may permit for greater protection of source/drain regions during source/drain contact formation, may increase a process window for the formation of the source/drain contacts, and may protect a surrounding interlayer dielectric (ILD) during silicidation for the source/drain contact.

FIG. 1 illustrates an example of simplified FinFETs in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as four transistors.

The FinFETs comprise fins 52 extending from a substrate 50. Isolation regions 56 are disposed over the substrate 50, and the fins 52 protrude above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refers to the portions extending between the neighboring isolation regions 56.

Gate dielectrics 92 are along sidewalls and over top surfaces of the fins 52, and gate electrodes 94 are over the gate dielectrics 92. Source/drain regions 82 are disposed in opposite sides of the fin 52 with respect to the gate dielectrics 92 and gate electrodes 94. In embodiments where multiple transistors are formed, the source/drain regions 82 may be shared between various transistors. In embodiments where one transistor is formed from multiple fins 52, neighboring source/drain regions 82 may be electrically connected, such as through coalescing the source/drain regions 82 by epitaxial growth, or through coupling the source/drain regions 82 with a same source/drain contact.

FIG. 1 further illustrates several reference cross-sections. Cross-section A-A is along a longitudinal axis of a fin 52 and in a direction of, for example, a current flow between the source/drain regions 82. Cross-section B-B is perpendicular to cross-section A-A and is across neighboring source/drain regions 82 in the fins 52. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 24B are cross-sectional views of intermediate stages in the manufacturing of FinFETs, in accordance with some embodiments. FIGS. 2, 3, 4, and 5 are illustrated along reference cross-section A-A illustrated in FIG. 1. FIGS. 6A, 7A, 8A, 9A, 15A, 16A, 17A, 18A, 19A, 20A, 21A, 22A, 23A, and 24A are illustrated along reference cross-section A-A illustrated in FIGS. 1, and 6B, 7B, 8B, 9B, 15B, 16B, 17B, 18B, 19B, 20B, 21B, 22B, 23B, and 24B are illustrated along a similar cross-section B-B illustrated in FIG. 1.

Figure 2:
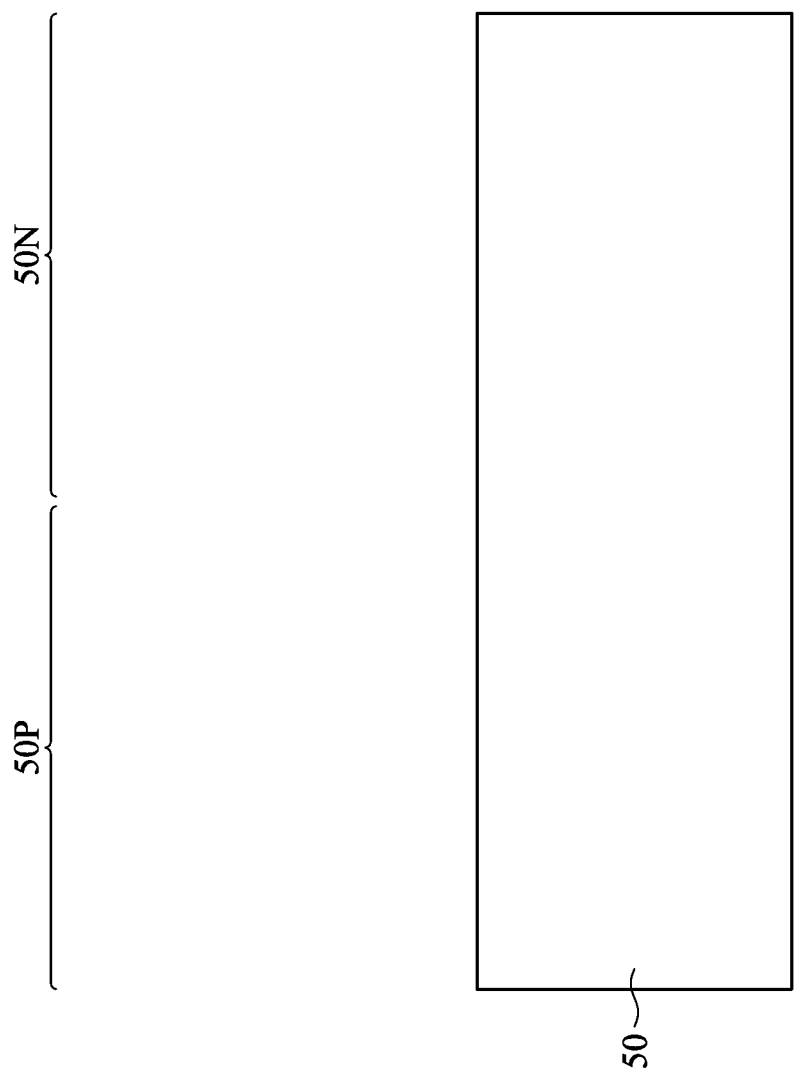

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Figure 3:
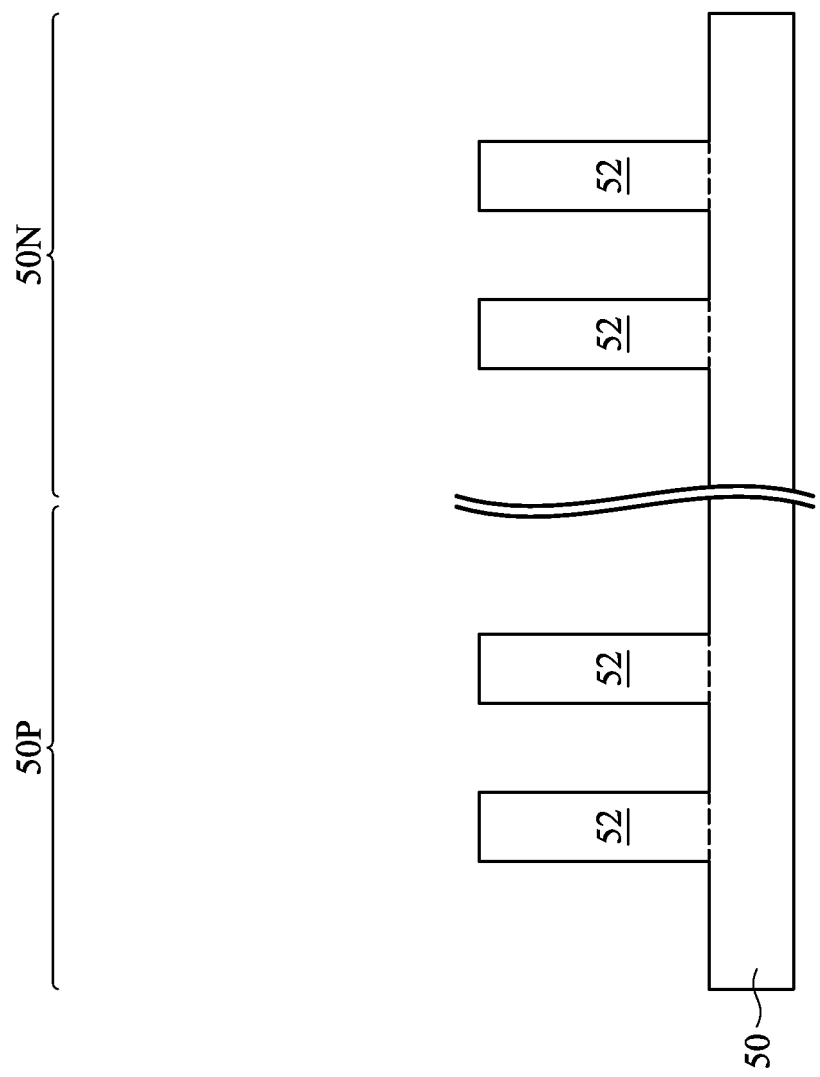

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
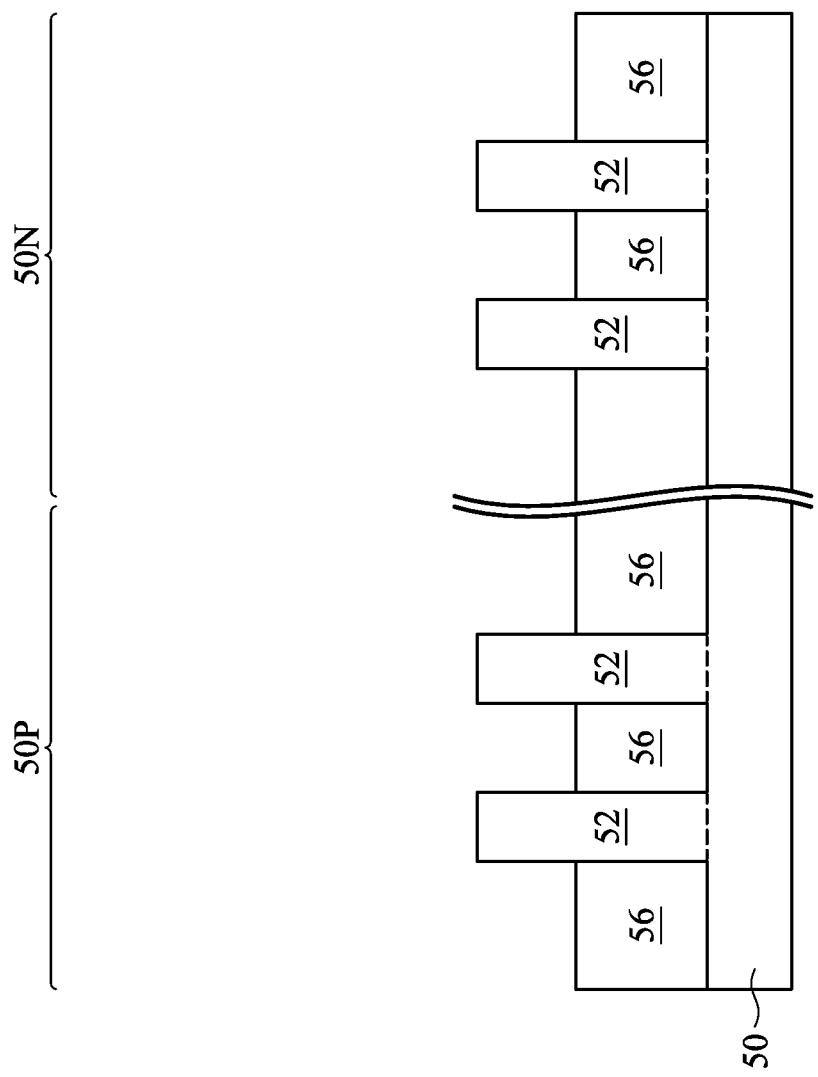

In FIG. 4, Shallow Trench Isolation (STI) regions 56 are formed between neighboring fins 52. As an example to form the STI regions 56, an insulation material is formed over the substrate 50 and between neighboring fins 52. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Although the insulation material is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner. A removal process is then applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 5:
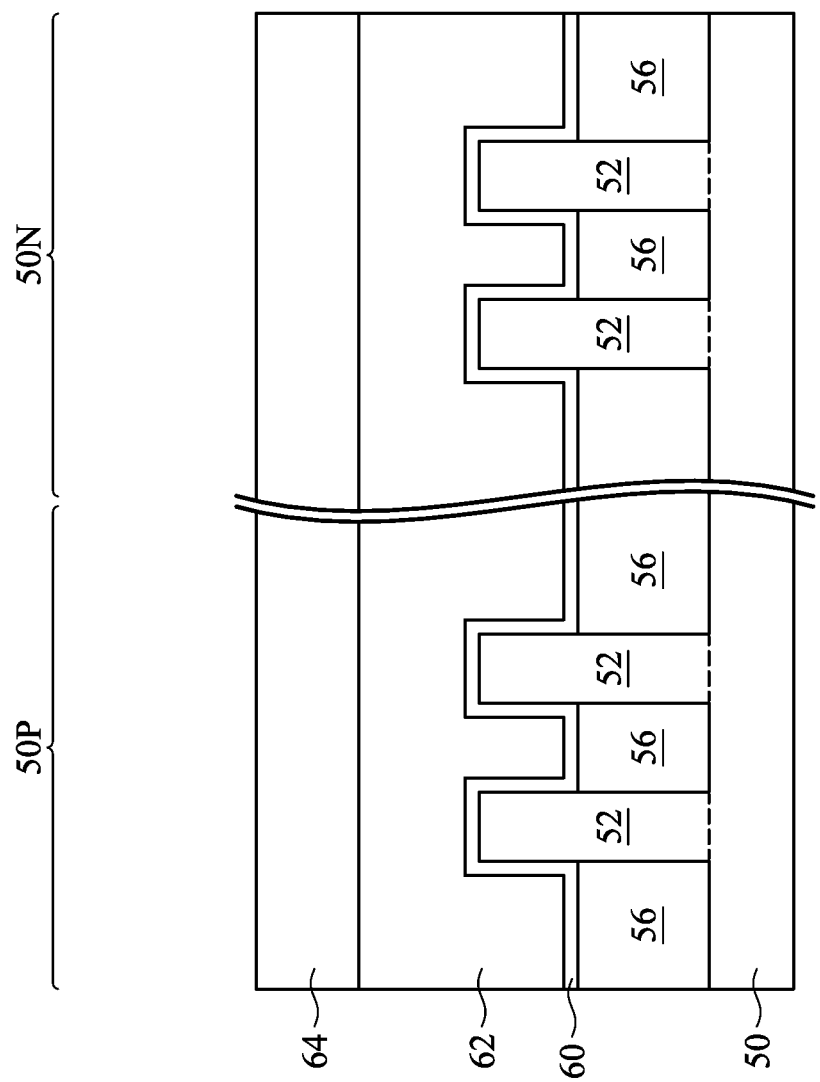

In FIG. 5, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), chemical vapor deposition (CVD), sputter deposition, or other techniques known and used in the art for depositing conductive materials. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 6A through 24B illustrate various additional steps in the manufacturing of embodiment devices. FIGS. 6A through 24B illustrate features in either of the region 50N and the region 50P. For example, embodiments described herein may be applicable to both the region 50N and the region 50P. Differences (if any) in the structures of the region 50N and the region 50P are described in the text accompanying each figure.

Figure 6B:
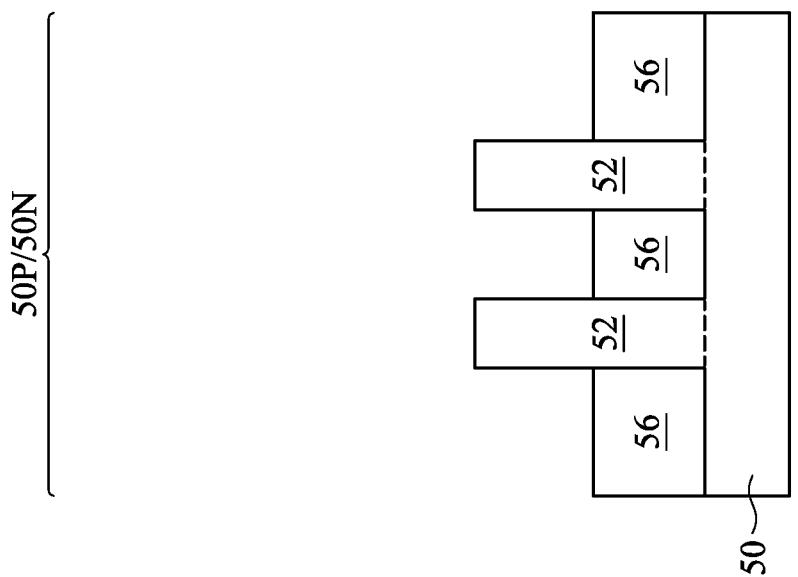
Figure 6A:
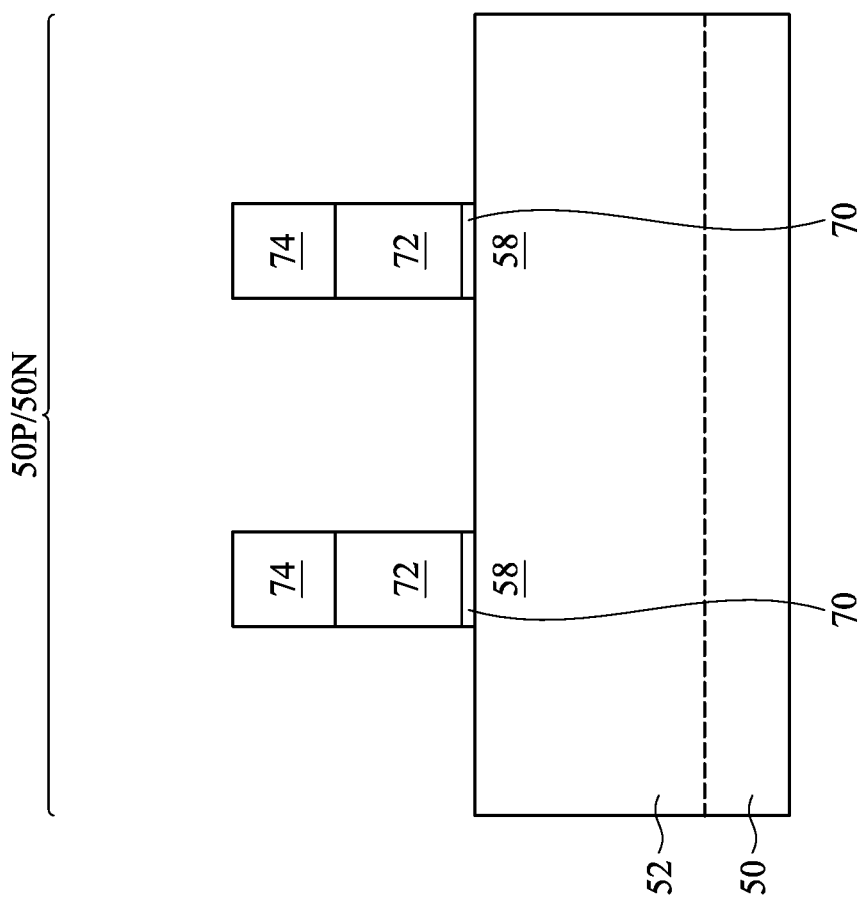

In FIGS. 6A and 6B, the mask layer 64 is patterned using acceptable photolithography and etching techniques to form masks 74. The pattern of the masks 74 then may be transferred to the dummy gate layer 62 to form dummy gates 72. The pattern of the masks 74 may also be transferred to the dummy dielectric layer 60 by an acceptable etching technique to form a dummy gate dielectrics 70. The dummy gates 72 (and optionally the dummy gate dielectrics 70) cover respective channel regions 58 of the fins 52. The pattern of the masks 74 may be used to physically separate each of the dummy gates 72 from adjacent dummy gates 72. The dummy gates 72 have a lengthwise direction substantially perpendicular to the lengthwise direction of respective fins 52.

Figure 7B:
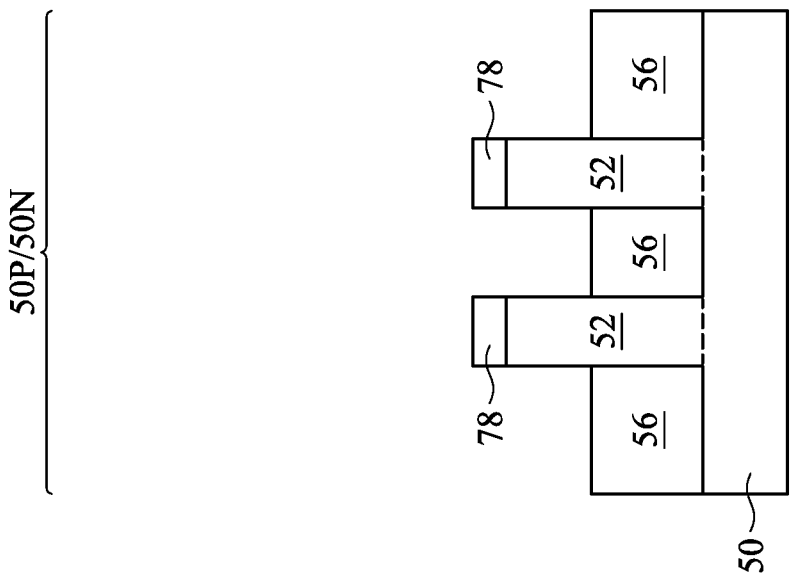
Figure 7A:
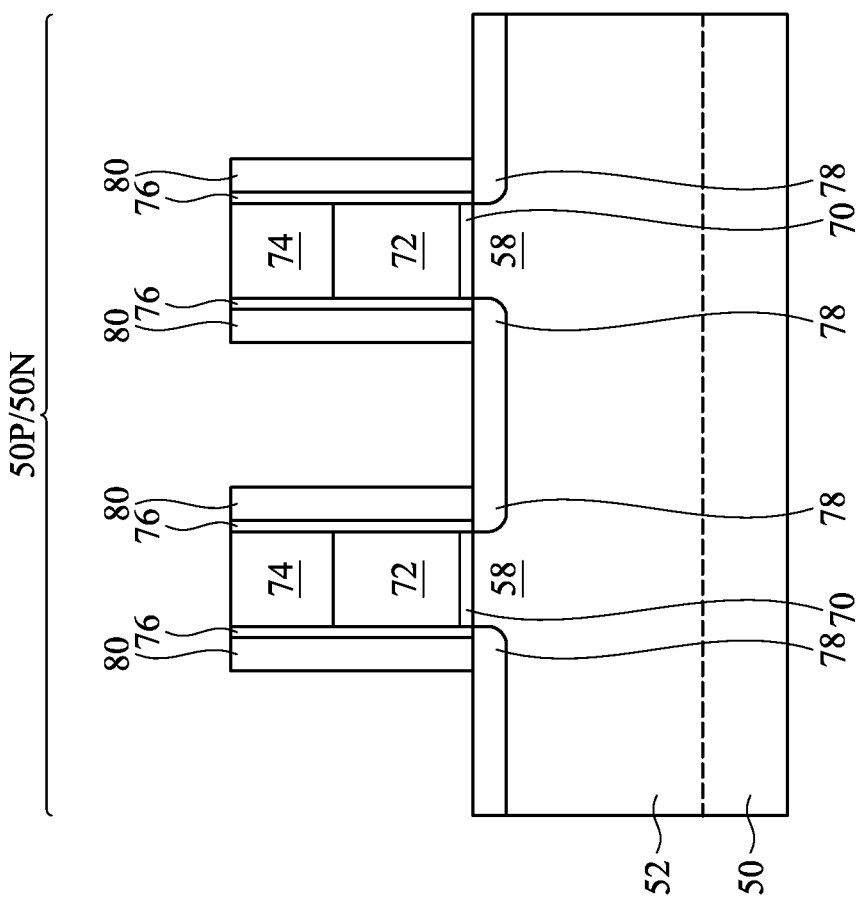

In FIGS. 7A and 7B, gate seal spacers 76 are formed on exposed surfaces of the masks 74, dummy gates 72, dummy gate dielectrics 70, and/or fins 52. A thermal oxidation or a deposition followed by an anisotropic etch may form the gate seal spacers 76.

After the formation of the gate seal spacers 76, implants for lightly doped source/drain (LDD) regions 78 may be performed. In the embodiments with different device types, a mask, such as a photoresist, may be formed over the region 50N, while exposing the region 50P, and appropriate type (e.g., p-type) impurities may be implanted into the exposed fins 52 in the region 50P. The mask may then be removed.

Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities. The impurities may be implanted in the fins 52 at an angle, and may experience diffusion during the anneal. As a result, the LDD regions 78 extend under the gate seal spacers 76 (and possibly edge portions of the dummy gates 72 and dummy gate dielectrics 70).

Further, gate spacers 80 are formed on the gate seal spacers 76 along sidewalls of the dummy gates 72 and the masks 74. The gate spacers 80 may be formed by conformally depositing an insulating material and subsequently anisotropically etching the insulating material. The insulating material of the gate spacers 80 may be silicon nitride, silicon carbonitride, a combination thereof, or the like.

Figure 8B:
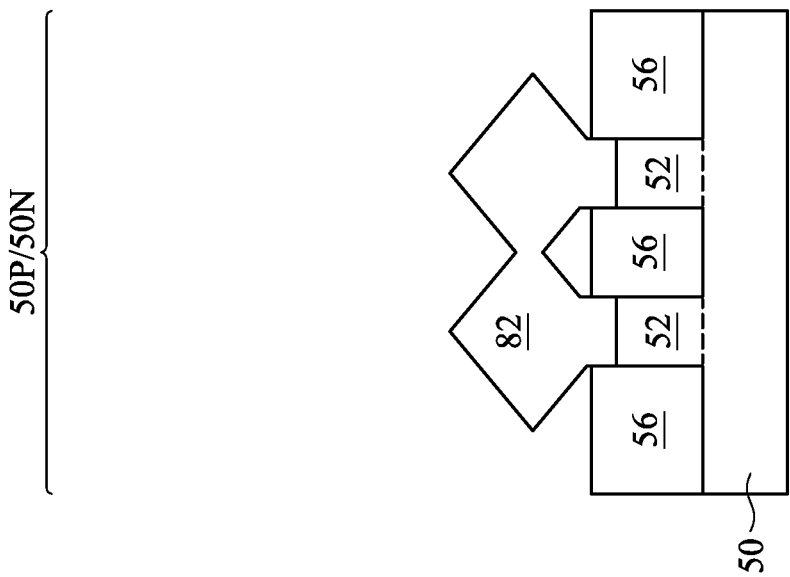
Figure 8A:
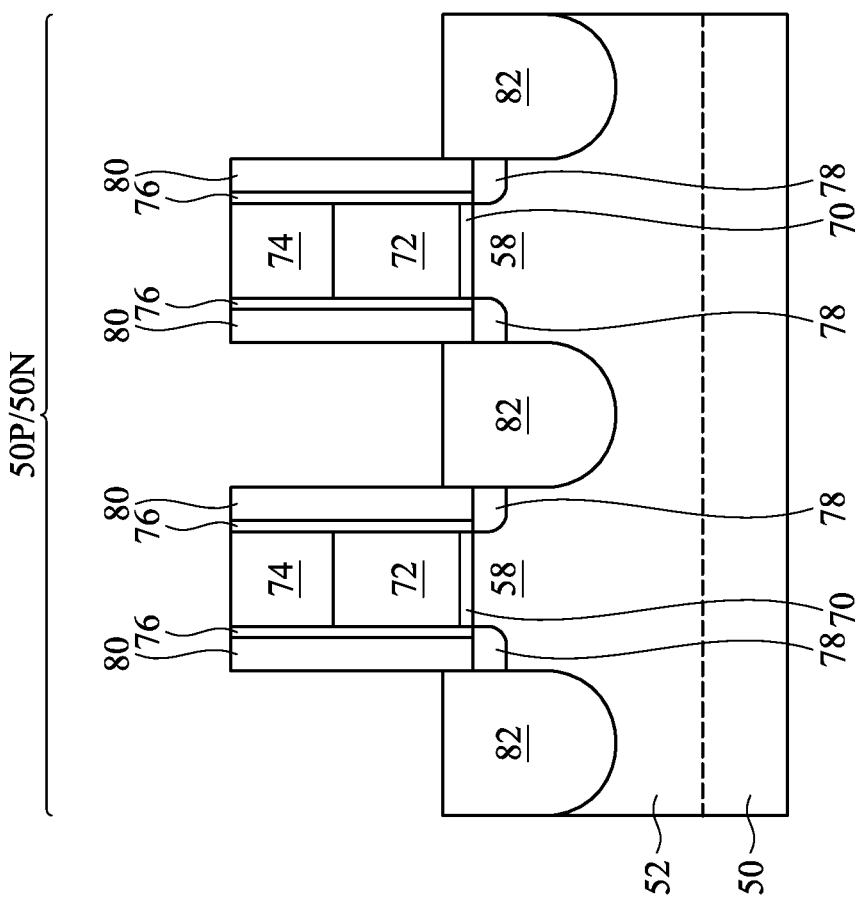

In FIGS. 8A and 8B, epitaxial source/drain regions 82 are formed in the fins 52 to exert stress in the respective channel regions 58, thereby improving performance. The epitaxial source/drain regions 82 are formed in the fins 52 such that each dummy gate 72 (and optionally dummy gate dielectric 70) is disposed between respective neighboring pairs of the epitaxial source/drain regions 82. In some embodiments the epitaxial source/drain regions 82 may extend into, and may also penetrate through, the fins 52. In some embodiments, the gate spacers 80 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as Si, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52 In the illustrated embodiment, these facets cause adjacent epitaxial source/drain regions 82 of a same FinFET to merge. In other embodiments, adjacent epitaxial source/drain regions 82 remain separated after the epitaxy process is completed.

In FIGS. 9A and 9B, a differential CESL 84 is deposited over the intermediate structure. Generally, an etch stop layer can provide a mechanism to stop an etch process when forming, e.g., contacts or vias. An etch stop layer may be formed of a dielectric material having a different etch selectivity from adjacent layers or components. The differential CESL 84 is formed on surfaces of the epitaxial source/drain regions 82, sidewalls and top surfaces of the gate spacers 80, top surfaces of the mask 74, and top surfaces of the STI regions 56. The differential CESL 84 has horizontal portions 84H, vertical portions 84V, and basin portions 84B. The horizontal portions 84H are formed on supporting surfaces that have respective horizontal components. The supporting surfaces with a horizontal component can be activated by a directional plasma activation during the formation of the differential CESL 84, as described in further detail below. The vertical portions 84V are formed on supporting surfaces that do not have a significant horizontal component (e.g., such that those surfaces are not activated by the directional plasma activation). The horizontal portions 84H have a thickness (e.g., in a direction perpendicular to respective supporting surfaces) that is greater than a thickness of the vertical portions 84V (e.g., in a direction perpendicular to respective supporting surfaces). The basin portions 84B are formed at junctions of the faceted upper surfaces of the epitaxial source/drain regions 82, and have a thickness that is greater than the horizontal portions 84H and vertical portions 84V.

The horizontal portions 84H have a thickness $T_H$ in a direction perpendicular to the supporting surface on which the respective horizontal portion is formed. The vertical portions 84V have a thickness $T_V$ in a direction perpendicular to the supporting surface on which the respective horizontal portion is formed. The basin portions 84B have a thickness $T_B$ in a direction perpendicular to the supporting surface on which the respective horizontal portion is formed. Each of these thicknesses are discussed further below.

The differential CESL 84 may be formed from a dielectric material such as silicon nitride, silicon carbon nitride, carbon nitride, the like, or a combination thereof. The differential CESL 84 may be deposited by a deposition process including a directional plasma activation, such as a plasma-enhanced atomic layer deposition (PEALD) process, plasma-enhanced chemical vapor deposition (PECVD) process, or the like.

Figure 10:
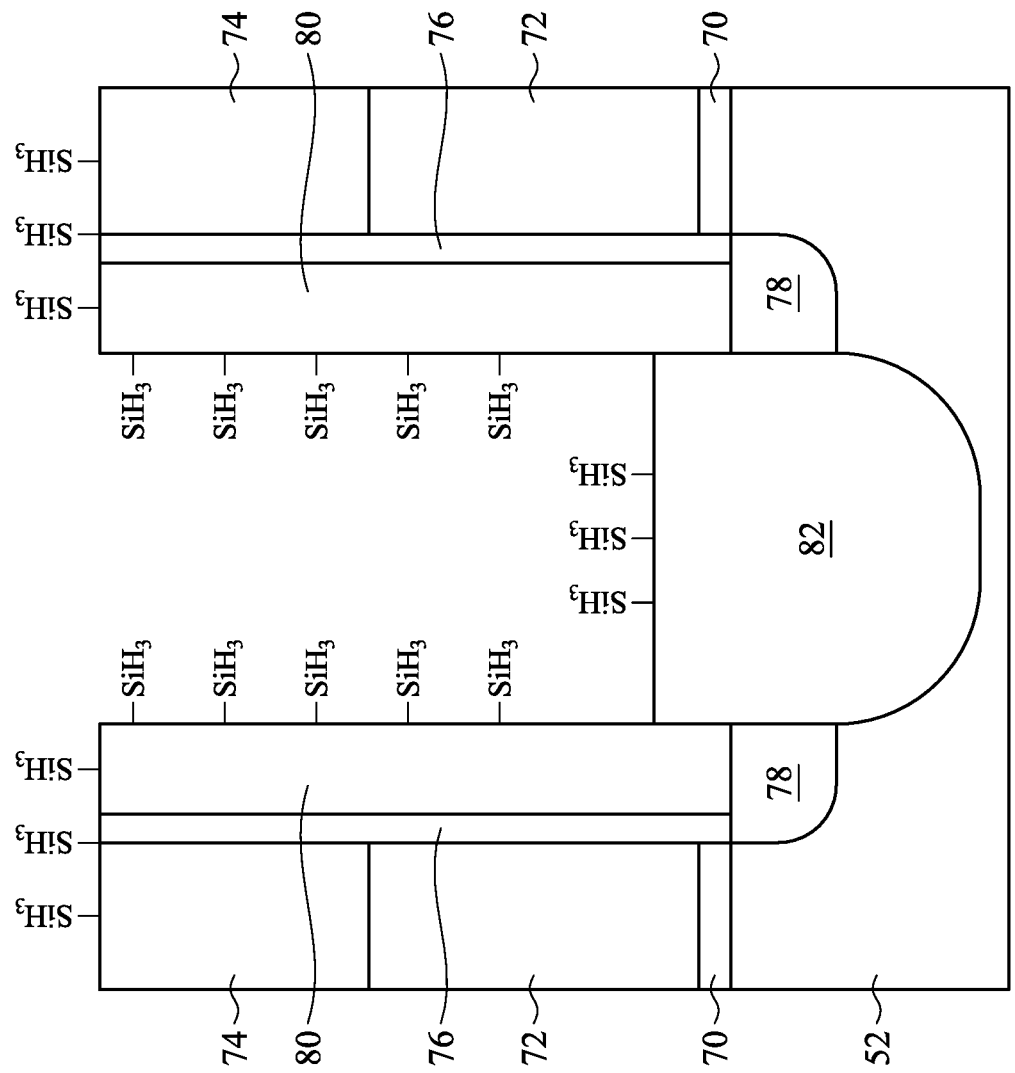
Figure 11:
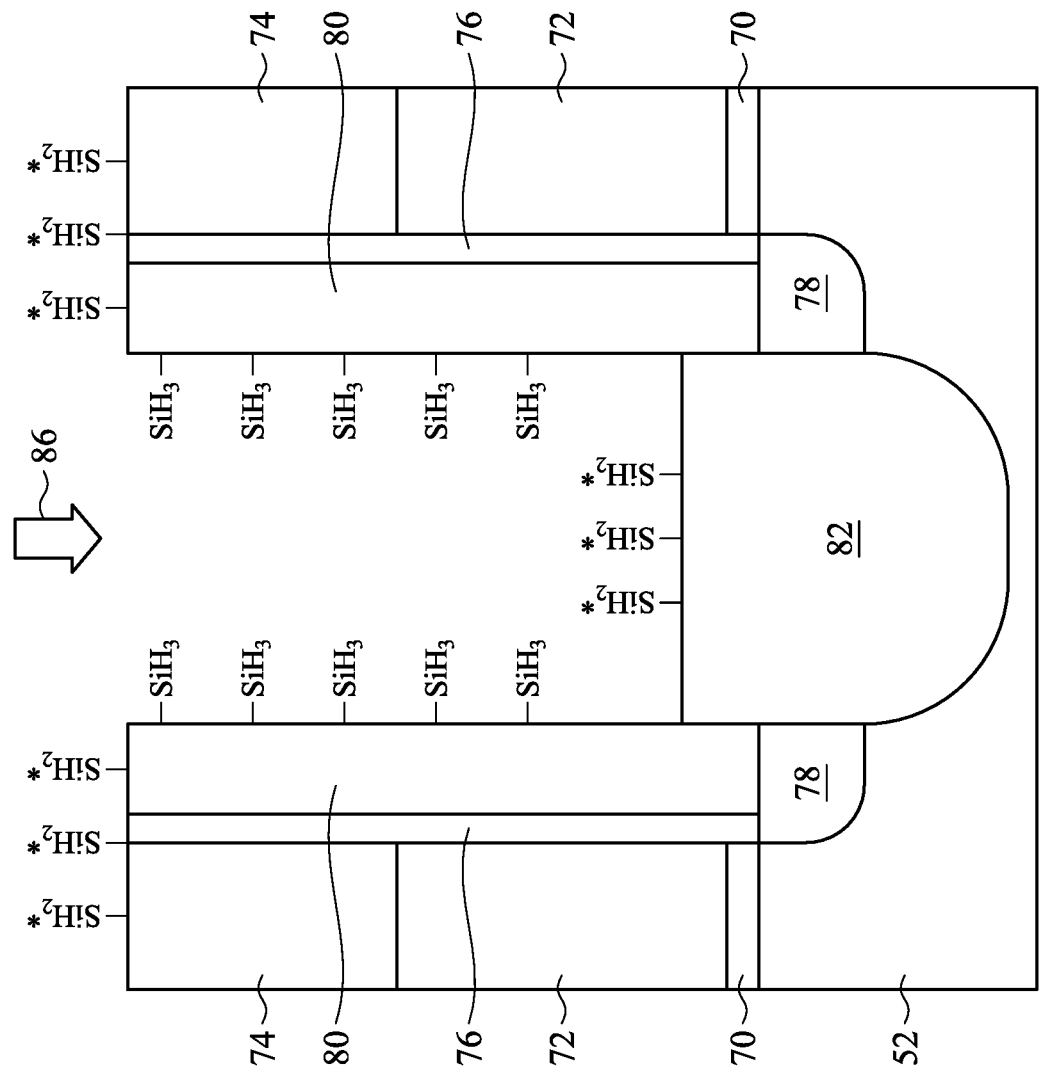
Figure 12:
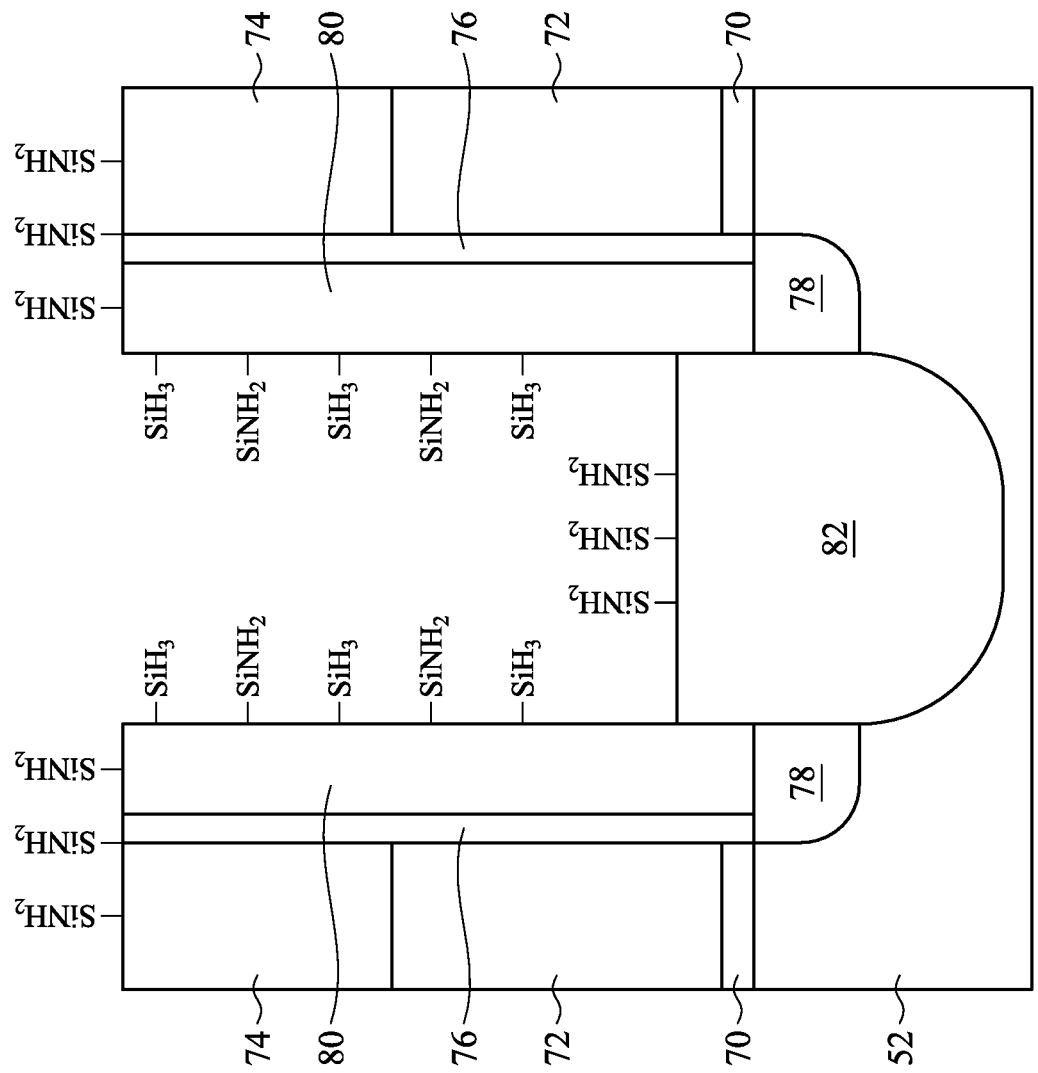
Figure 13:
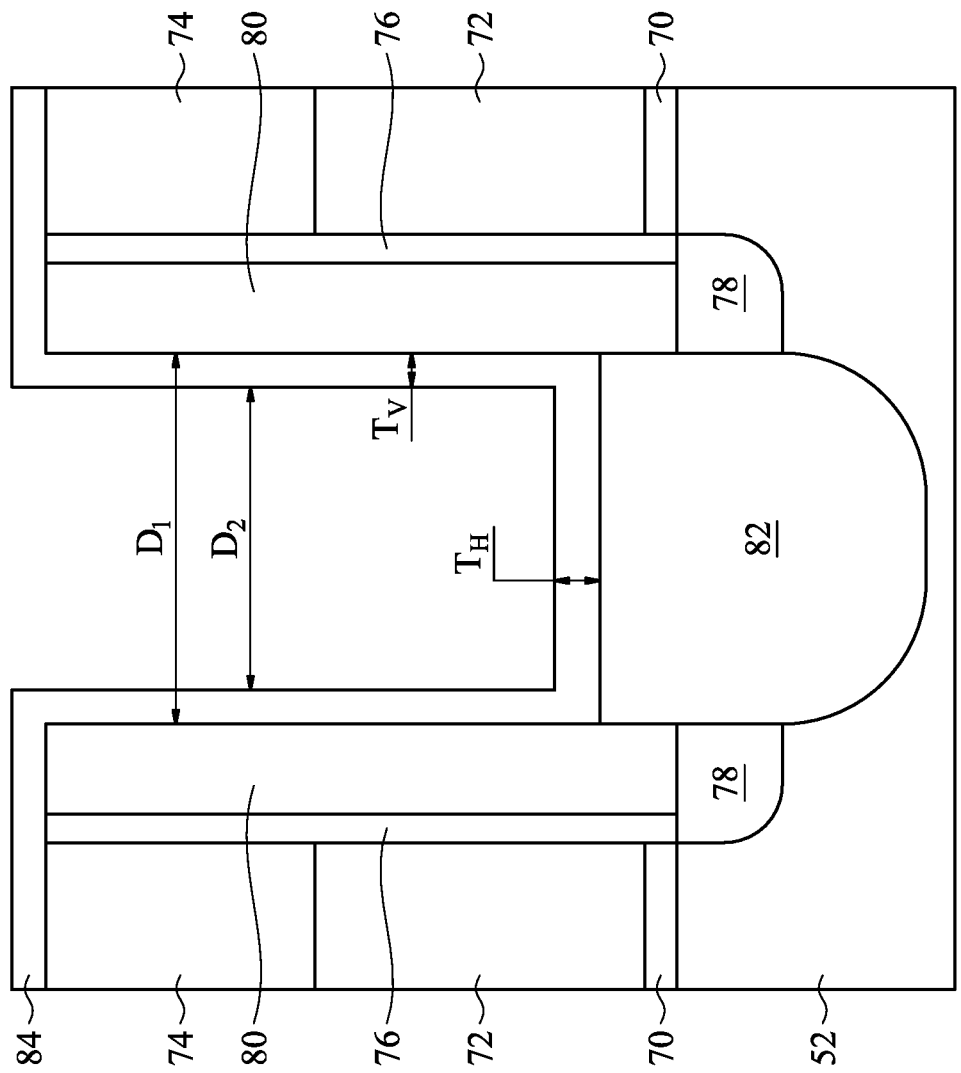

FIGS. 10 through 12 are cross-sectional views of intermediate stages of an example PEALD process for forming the differential CESL 84, in accordance with some embodiments. FIG. 13 is a cross-sectional showing the differential CESL 84 after formation. FIGS. 10 through 13 illustrate a region 10 of FIG. 9A. Although described in the context of a differential CESL, it should be appreciated that the illustrated PEALD process can be used to form any layer, such as a layer that is not an etch stop layer. Further, although the example PEALD process is used to form a differential layer of silicon nitride, it should be appreciated that other material layers may be formed.

In FIG. 10, a monolayer is formed on the intermediate structure by exposure to a first precursor in the PEALD process. The intermediate structure is exposed to a first precursor, such as dichlorosilane (DCS) or another precursor depending on the material to be deposited. In the illustrated example, a DCS precursor is used and forms a monolayer of $SiH_3$ along exterior surfaces of the intermediate structure exposed to the DCS precursor. The exterior surfaces include top surfaces of the masks 74, sidewalls and top surfaces of the gate spacers 80, upper surfaces of the epitaxial source/drain regions 82, and top surfaces of the STI regions 56 (see FIG. 9B). In other examples, a different precursor may be used, which forms a monolayer of a different material. Following exposure to the first precursor, the first precursor may be purged from the tool chamber used to expose the intermediate structure to the first precursor.

In FIG. 11, a directional plasma activation 86 is performed on the monolayer. The directional, or anisotropic, plasma activation activates portions of the monolayer for increased reactions with a subsequent precursor. Portions of the monolayer on respective upper surfaces of the intermediate structure that have horizontal components are activated by the directional plasma activation 86, whereas portions of the monolayer on respective surfaces that do not have a horizontal component may not be activated by the directional plasma activation 86. Activation of surfaces may increase based on an increased horizontal component of the surface. For example, surfaces with no or little horizontal component can have no or little activation, whereas surfaces with a greater horizontal component can have a greater activation.

In the illustrated example, the upper surfaces of the epitaxial source/drain regions 82 are faceted such that the respective upper surfaces of the epitaxial source/drain regions 82 have a horizontal component and a vertical component (see FIG. 9B). The monolayer on these upper surfaces of the epitaxial source/drain regions 82 are activated by the directional plasma activation 86. The sidewalls of the gate spacers 80 are largely vertical with a small (or no) horizontal component, and hence, are not significantly activated by the directional plasma activation 86.

During the directional plasma activation 86, an argon directional plasma activates portions of the monolayer on upper surfaces of the intermediate structure that have a horizontal component to modify the $SiH_3$ in those portions to activated $SiH_2^*$. In some examples, the plasma process implemented to activate the monolayer can be a microwave remote plasma, although other plasma sources, such as a direct plasma, may be implemented. A flow rate of the argon gas for the plasma can be in a range from about 1,000 sccm to about 9,000 sccm. A pressure of the plasma process can be in a range from about 0.5 Torr to about 25 Torr. As discussed further below, the pressure may be varied according to the desired difference in thickness between the horizontal portions 84H and vertical portions 84V of the differential CESL 84. A temperature of the plasma process can be in a range from about 200° C. to about 650° C. A power of the plasma generator of the plasma process can be in a range from about 50 W to about 4,000 W. A frequency of the plasma generator can be in a range from about 13.56 MHz to about 2.45 GHz. A substrate holder of the plasma process can be unbiased. A duration of the exposure of the intermediate structure to the plasma process can be in a range from 0.1 second to 120 seconds. In other examples, a different plasma, such as a different plasma process, conditions, and/or gas (such as an inert gas, nitrogen gas, or the like), may be used to activate portions of the monolayer. By activating the portions of the monolayer with the directional plasma activation 86, more reaction sites are created on the activated portions of the monolayer to react with a subsequent precursor in the PEALD process. The directional plasma activation 86 may be performed in situ, e.g., in the same tool chamber used to expose the intermediate structure to the first precursor and, subsequently, a second precursor.

In FIG. 12, a layer formed is on the intermediate structure by exposure to a second precursor in the PEALD process. The intermediate structure is exposed to a second precursor, such as an ammonia ($NH_3$) plasma or another precursor depending on the material to be deposited, for example. The second precursor reacts with activated portions of the monolayer more than portions of the monolayer that are not activated. For example, due to the increased reaction sites formed on the activated portions of the monolayer from the directional plasma activation 86, more reactions between the monolayer at the activated portions and the second precursor will occur than between the monolayer at the non-activated portions and the second precursor. This causes the differential CESL 84 to be deposited at a greater rate on upper surfaces having a horizontal component, where activation occurs, than on vertical surfaces that do not have a significant horizontal component, where activation generally does not occur.

In the illustrated example, an ammonia ($NH_3$) plasma precursor is used and reacts with most, or in some instances, all, of the activated $SiH_2^*$ and some of the non-activated $SiH_3$ (e.g., less than the activated $SiH_2^*$) to form silicon nitride (e.g., $SiNH_2$). For example, an ammonia ($NH_3$) precursor gas can be flowed in the plasma process at a flow rate in a range from about 50 sccm to about 1,000 sccm. Hence, in the illustrated example, more $SiNH_2$ is deposited on upper surfaces having a horizontal component than on vertical surfaces that do not have a significant horizontal component. In other examples, a different precursor may be used, which may form a layer of a different material. Following exposure to the second precursor, the second precursor may be purged from the tool chamber used to expose the intermediate structure to the second precursor.

FIGS. 10 through 12 illustrate a single cycle of the PEALD process, e.g., for forming a single layer. The processing described may be repeated any number of times, depending on the desired thickness of the differential CESL 84.

FIG. 13 illustrates aspects of the differential CESL 84 formed using the PEALD process described above. The differential CESL 84 includes horizontal portions 84H on underlying upper surfaces having a horizontal component and includes vertical portions 84V on supporting vertical surfaces that do not have a significant horizontal component. The horizontal portions 84H have a thickness $T_H$ in a direction perpendicular to the supporting surface on which the respective horizontal portion is formed. The vertical portions 84V have a thickness $T_V$ in a direction perpendicular to the supporting surface on which the respective horizontal portion is formed. The basin portions 84B have a thickness $T_B$ (see FIG. 9B) in a direction perpendicular to the supporting surface on which the respective horizontal portion is formed. The thickness $T_H$ of the horizontal portions 84H is large, and is greater than the thickness $T_V$ of the vertical portions 84V. In some examples, the thickness $T_H$ of the horizontal portions 84H is at least 2 nm more than the thickness $T_V$ of the vertical portions 84V. For example, the thickness $T_H$ of the horizontal portions 84H can be from about 2.2 nm to about 12 nm (such as about 4 nm), and the thickness $T_V$ of the vertical portions 84V can be from about 2 nm to about 9 nm (such as about 2 nm). In some examples, a ratio of the thickness $T_H$ of the horizontal portions 84H to the thickness $T_V$ of the vertical portions 84V is at least 1.1, and may be equal to or greater than 2. By decreasing the thickness $T_V$ of the vertical portions 84V, the parasitic capacitance between the epitaxial source/drain regions 82 and subsequently formed transistor gates may be reduced. The thickness $T_B$ of the basin portions 84B is large, and is greater than the thickness $T_V$ of the vertical portions 84V and the thickness $T_H$ of the horizontal portions 84H. In some examples, the thickness $T_B$ of the basin portions 84B is at least 0.5 nm more than the thickness $T_H$ of the horizontal portions 84H. For example, the thickness $T_B$ of the basin portions 84B can be from about 2.7 nm to about 14 nm.

A first dimension $D_1$ is illustrated between facing sidewall surfaces of neighboring gate spacers 80 on which respective vertical portions 84V of the differential CESL 84 are formed. A second dimension $D_2$ is illustrated between facing surfaces of vertical portions 84V of the differential CESL 84. Generally, the first dimension $D_1$ is equal to the second dimension $D_2$ plus two times the thickness $T_V$ of the vertical portions 84V. In some embodiments, the second dimension $D_2$ is in the range of from about 2 nm to about 10 nm.

Figure 14:
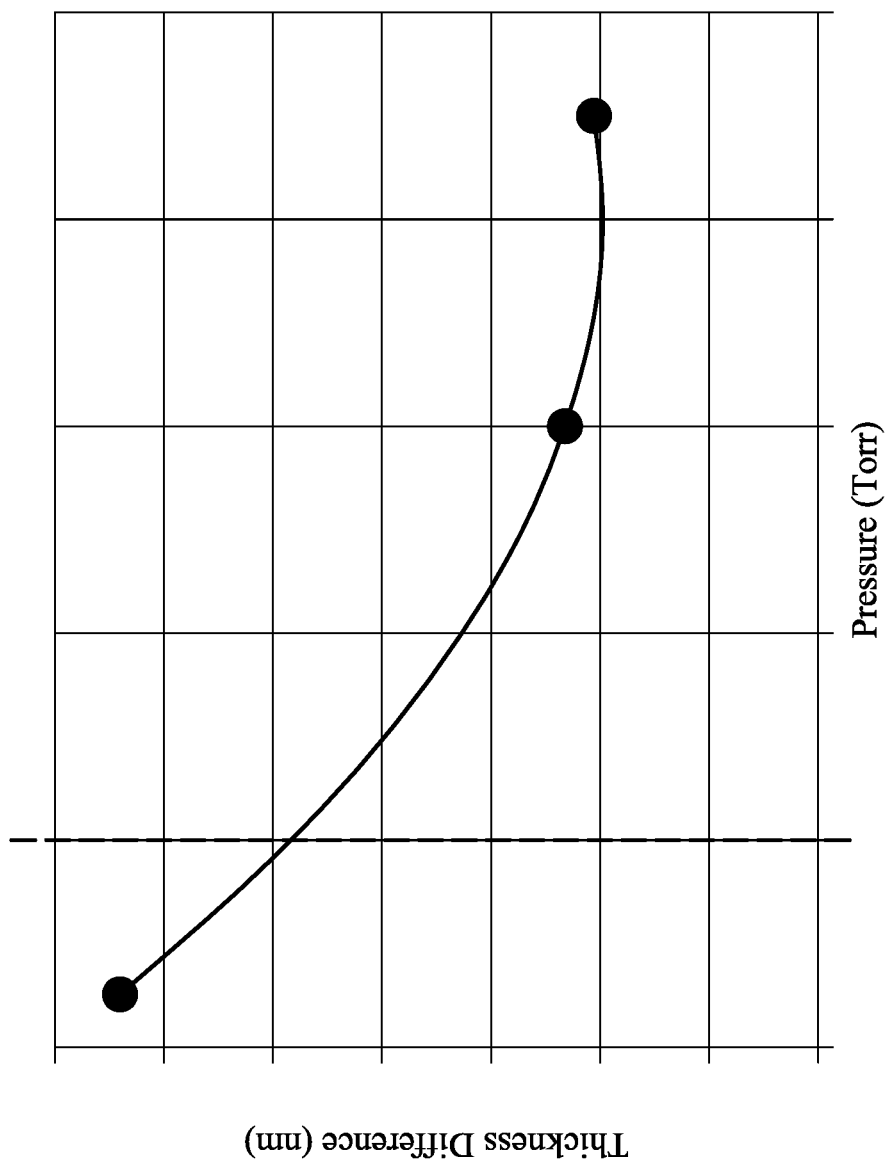
FIG. 14 illustrates relationships between the thickness(es) of a differential CESL and processing conditions during a directional plasma activation, in accordance with some embodiments.

FIG. 14 illustrates the relationship between the thickness (es) of the differential CESL 84 and the processing pressure during the directional plasma activation 86. The difference between the thicknesses $T_H$ and $T_V$ (see FIG. 14) is plotted as a function of the processing pressure. As shown, the difference in thickness sharply decreases as pressure increases. In embodiments where the thickness $T_H$ is at least 2 nm more than the thickness $T_V$, the processing pressure may be controlled to be less than 5 Torr.

Figures 15A, 15B:
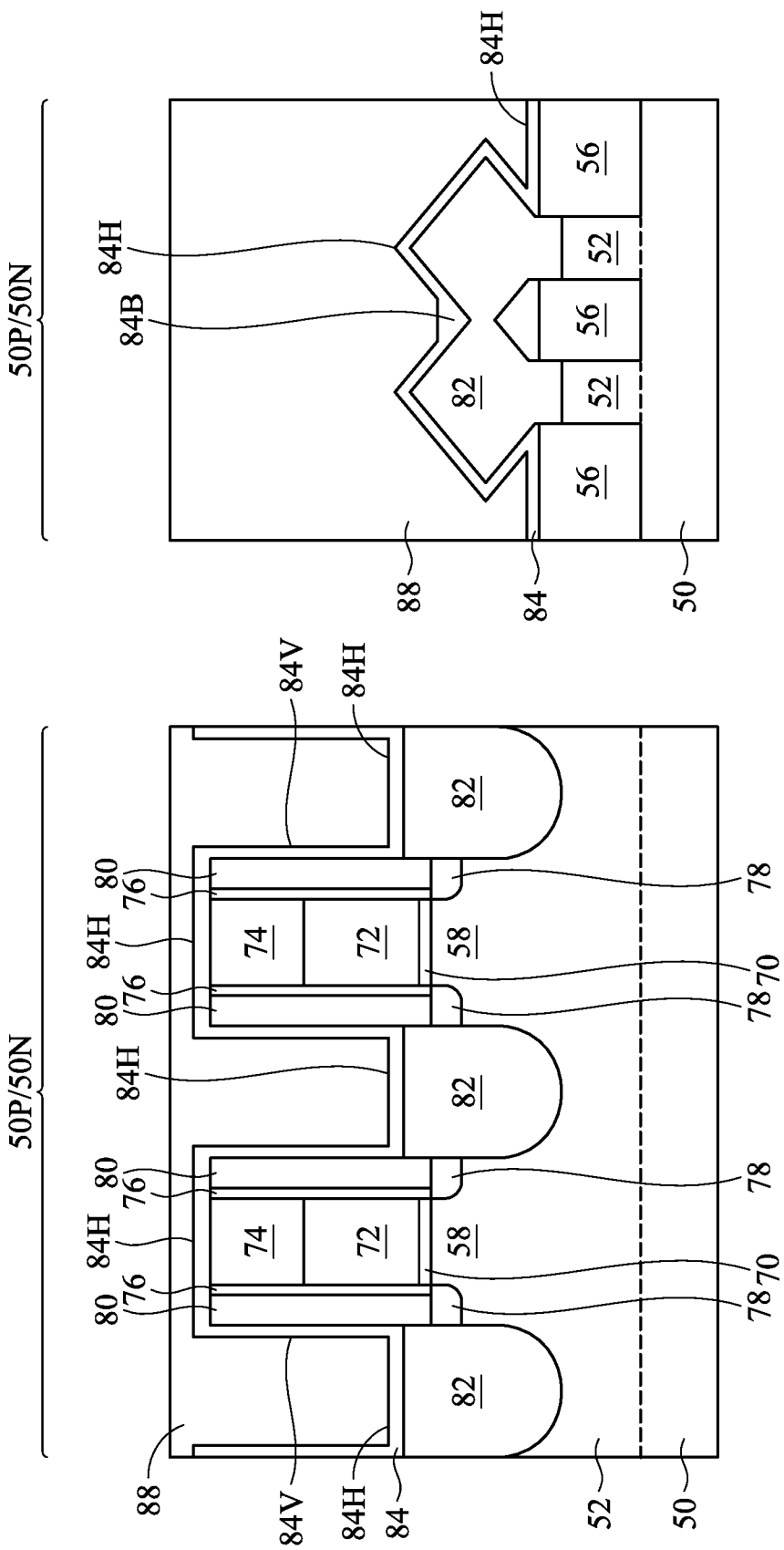
FIGS. 15A, 15B, 16A, 16B, 17A, 17B, 18A, 18B, 18C, 19A, 19B, 20A, 20B, 21A, 21B, 22A, 22B, 23A, 23B, 24A, and 24B are cross-sectional views of further intermediate stages in the manufacturing of FinFETs, in accordance with some embodiments.

In FIGS. 15A and 15B, a first ILD 88 is deposited over the differential CESL 84. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. After formation, the first ILD 88 may be cured, such as by an ultraviolet curing process. Because the thickness $T_V$ of the vertical portions 84V of the differential CESL 84 are reduced, width of the first ILD 88 between neighboring gate spacers 80 may be increased. The increased width may help increase uniformity of the ultraviolet curing process, which may help avoid the formation of voids in the first ILD 88. Further, by increasing the width of the first ILD 88 between neighboring gate spacers 80, the processing window for etching source/drain contacts may be increased.

Figure 16A:
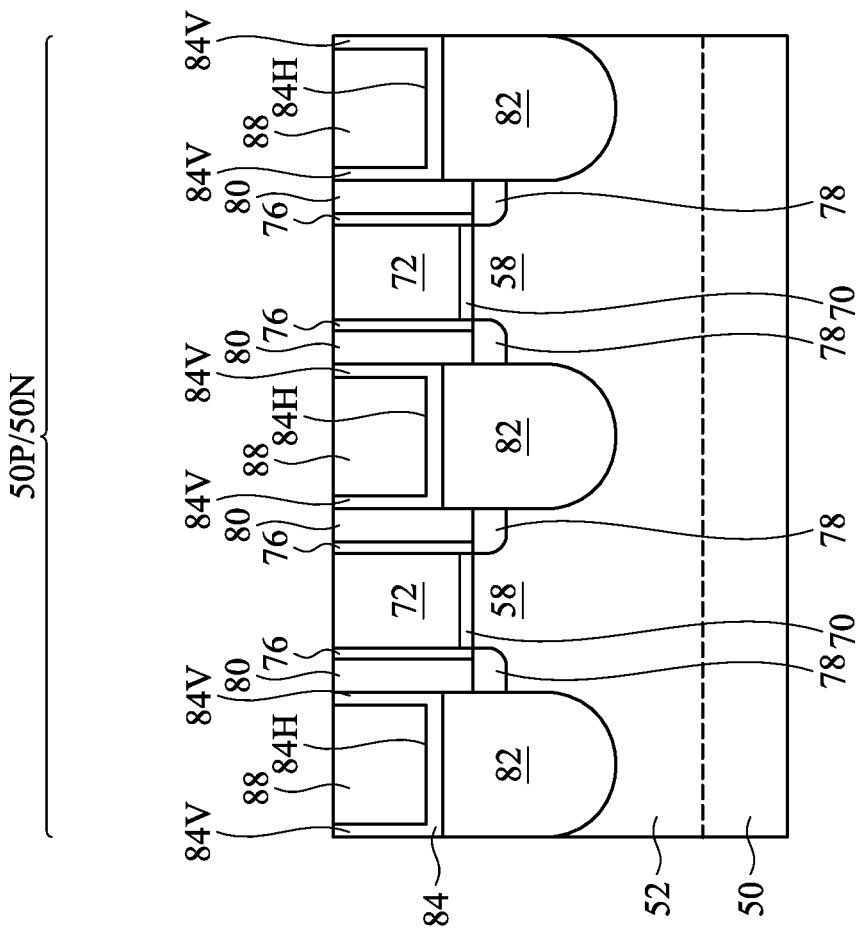
Figure 16B:
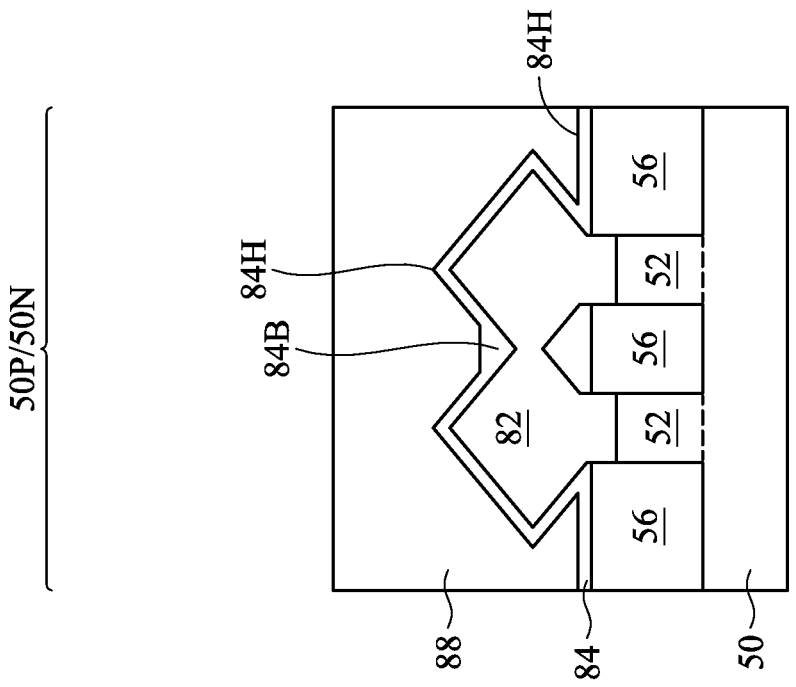

In FIGS. 16A and 16B, a planarization process, such as a CMP, may be performed to level the top surface of the first ILD 88 and differential CESL 84 with the top surfaces of the dummy gates 72 or the masks 74. The planarization process may also remove the masks 74 on the dummy gates 72, and portions of the gate seal spacers 76 and the gate spacers 80 along sidewalls of the masks 74. After the planarization process, top surfaces of the dummy gates 72, gate seal spacers 76, gate spacers 80, differential CESL 84, and first ILD 88 are level. Accordingly, the top surfaces of the dummy gates 72 are exposed through the first ILD 88. The planarization process may remove horizontal portions 84H of the differential CESL 84 overlying the dummy gates 72, such that the remaining horizontal portions 84H of the differential CESL 84 are overlying the epitaxial source/drain regions 82 and STI regions 56. In some embodiments, the masks 74 may remain, in which case the planarization process levels the top surface of the first ILD 88 with the top surfaces of the masks 74.

Figure 17B:
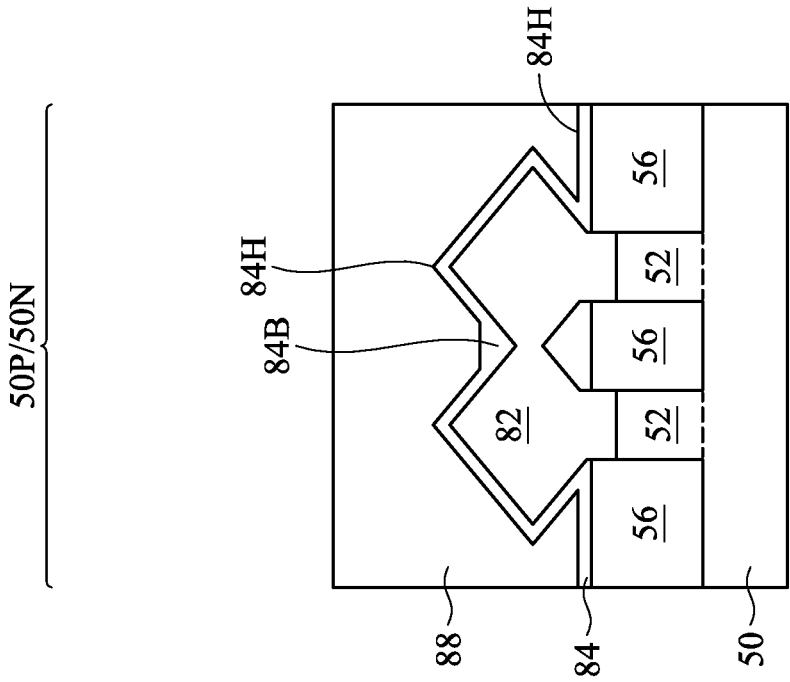
Figure 17A:
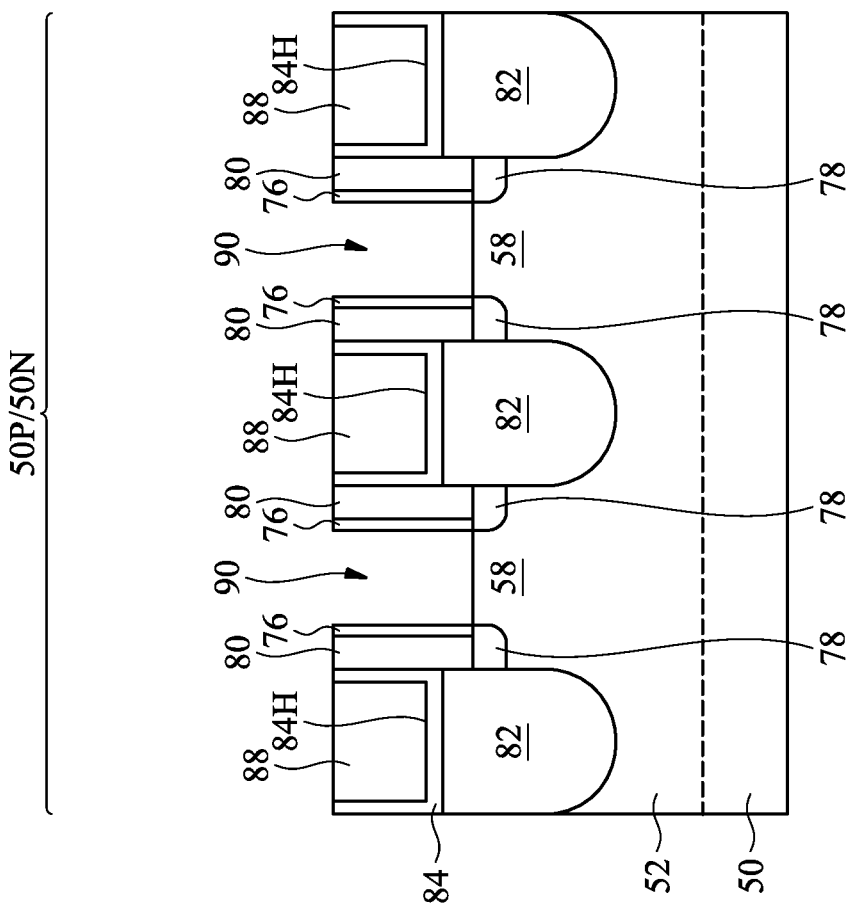

In FIGS. 17A and 17B, the dummy gates 72, and the masks 74 if present, are removed in an etching step(s), so that recesses 90 are formed. The dummy gate dielectrics 70 in the recesses 90 may also be removed. In some embodiments, only the dummy gates 72 are removed and the dummy gate dielectrics 70 remain and are exposed by the recesses 90. In some embodiments, the dummy gate dielectrics 70 are removed from recesses 90 in a first region of a die (e.g., a core logic region) and remain in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 80. Each recess 90 exposes a channel region 58 of a respective fin 52. Each channel region 58 is disposed between neighboring pairs of the epitaxial source/drain regions 82. During the removal, the dummy gate dielectrics 70 may be used as etch stop layers when the dummy gates 72 are etched. The dummy gate dielectrics 70 may then be optionally removed after the removal of the dummy gates 72.

Figure 18B:
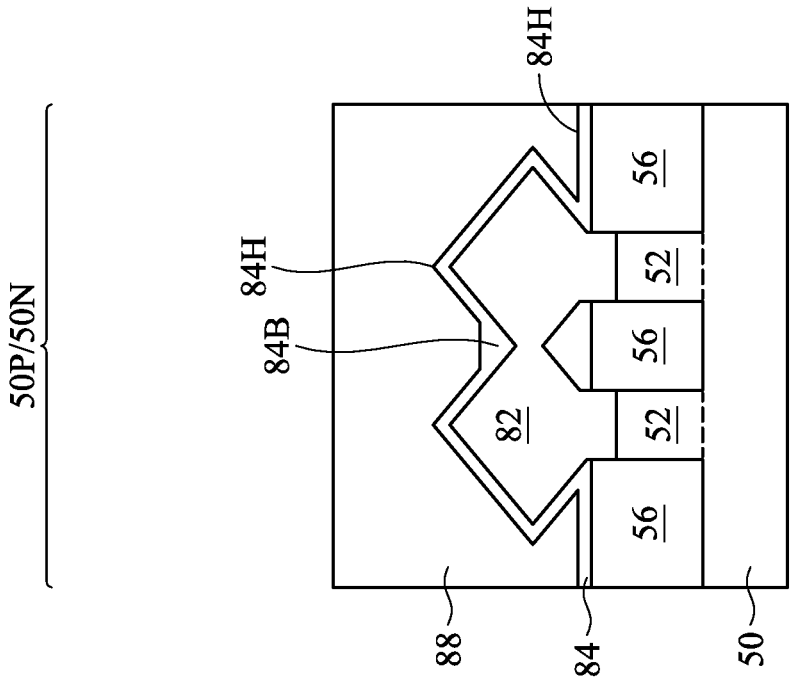
Figure 18A:
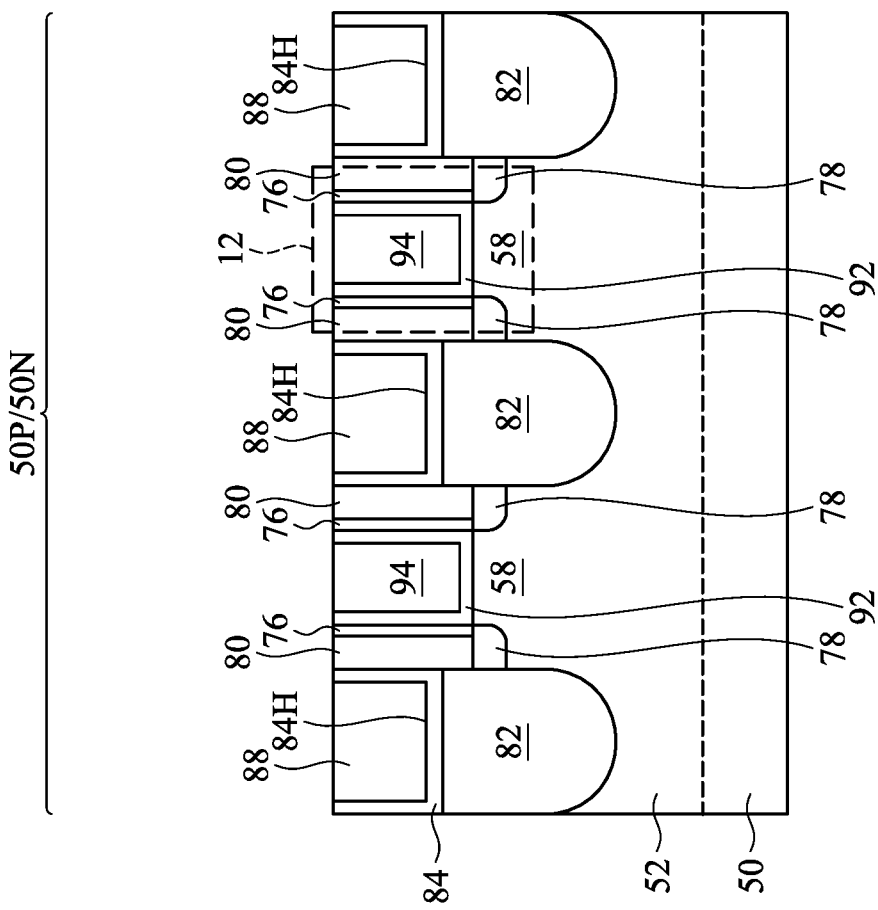
Figure 18C:
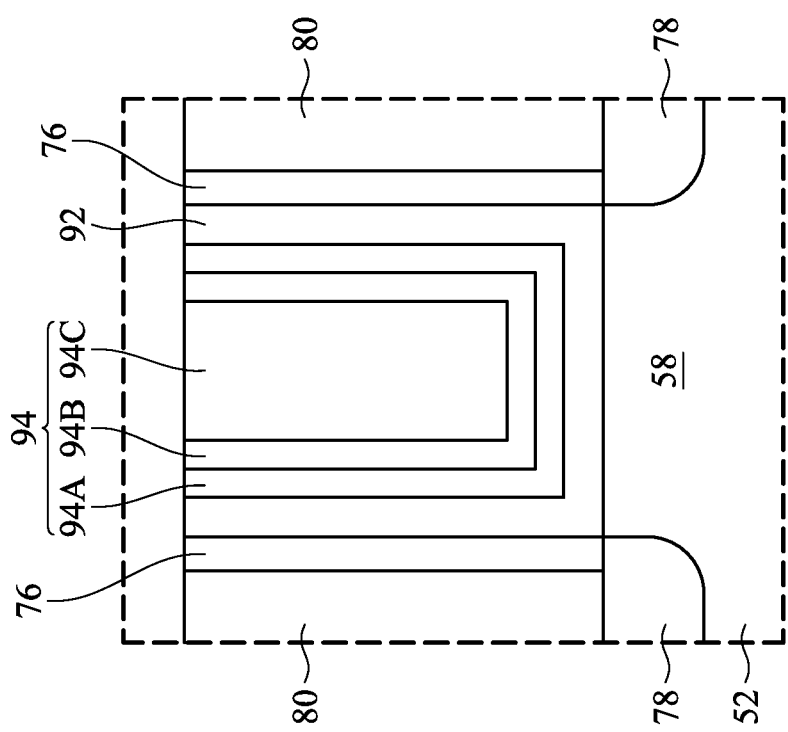

In FIGS. 18A and 18B, gate dielectrics 92 and gate electrodes 94 are formed for replacement gates. FIG. 18C illustrates a detailed view of region 12 of FIG. 18A. The gate dielectrics 92 are deposited conformally in the recesses 90, such as on the top surfaces and the sidewalls of the fins 52 and on sidewalls of the gate seal spacers 76/gate spacers 80. The gate dielectrics 92 may also be formed on top surface of the first ILD 88. In accordance with some embodiments, the gate dielectrics 92 comprise silicon oxide, silicon nitride, or multilayers thereof. In some embodiments, the gate dielectrics 92 include a high-k dielectric material, and in these embodiments, the gate dielectrics 92 may have a k value greater than about 7.0, and may include a metal oxide or a silicate of Hf, Al, Zr, La, Mg, Ba, Ti, Pb, and combinations thereof. The formation methods of the gate dielectrics 92 may include Molecular-Beam Deposition (MBD), atomic layer deposition (ALD), PECVD, and the like. In embodiments where the dummy gate dielectrics 70 remain in the recesses 90, the gate dielectrics 92 include a material of the dummy gate dielectrics 70 (e.g., $SiO_2$).

The gate electrodes 94 are deposited over respective gate dielectrics 92, and fill the remaining portions of the recesses 90. The gate electrodes 94 may include a metal-containing material such as TiN, TiO, TaN, TaC, Co, Ru, Al, W, combinations thereof, or multi-layers thereof. The gate electrode 94 may comprise any number of liner layers 94A, any number of work function tuning layers 94B, and a fill material 94C (see FIG. 18C). After the filling of the gate electrodes 94, a planarization process, such as a CMP, may be performed to remove the excess portions of the gate dielectrics 92 and the material of the gate electrodes 94, which excess portions are over the top surface of the first ILD 88. The remaining portions of material of the gate electrodes 94 and the gate dielectrics 92 thus form replacement gates of the resulting FinFETs. The gate electrodes 94 and the gate dielectrics 92 may be collectively referred to as a "gate stack." The gate stacks extend along sidewalls of the channel regions 58 of the fins 52.

The formation of the gate dielectrics 92 in the region 50N and the region 50P may occur simultaneously such that the gate dielectrics 92 in each region are formed from the same materials, and the formation of the gate electrodes 94 may occur simultaneously such that the gate electrodes 94 in each region are formed from the same materials. In some embodiments, the gate dielectrics 92 in each region may be formed by distinct processes, such that the gate dielectrics 92 may be different materials, and/or the gate electrodes 94 in each region may be formed by distinct processes, such that the gate electrodes 94 may be different materials. Various masking steps may be used to mask and expose appropriate regions when using distinct processes.

Figure 19B:
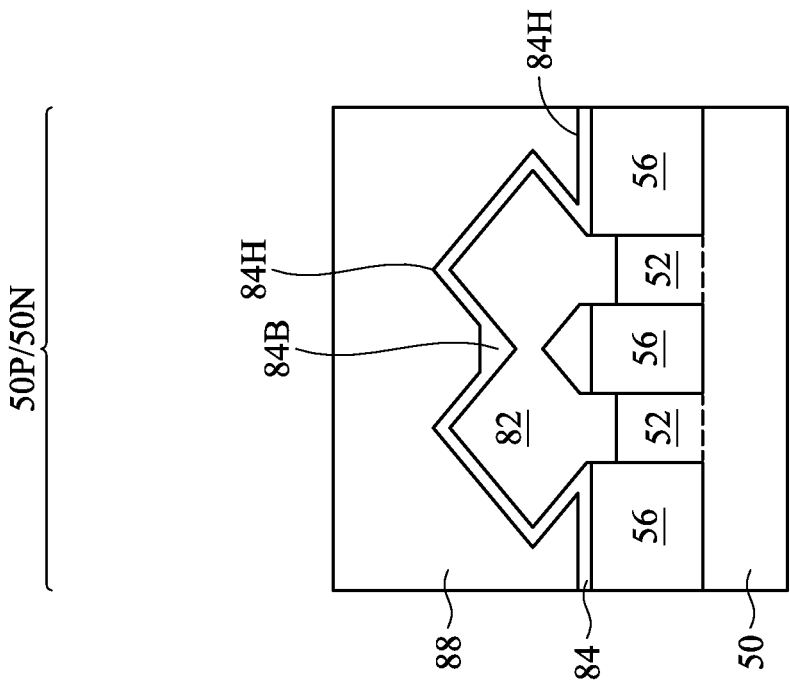
Figure 19A:
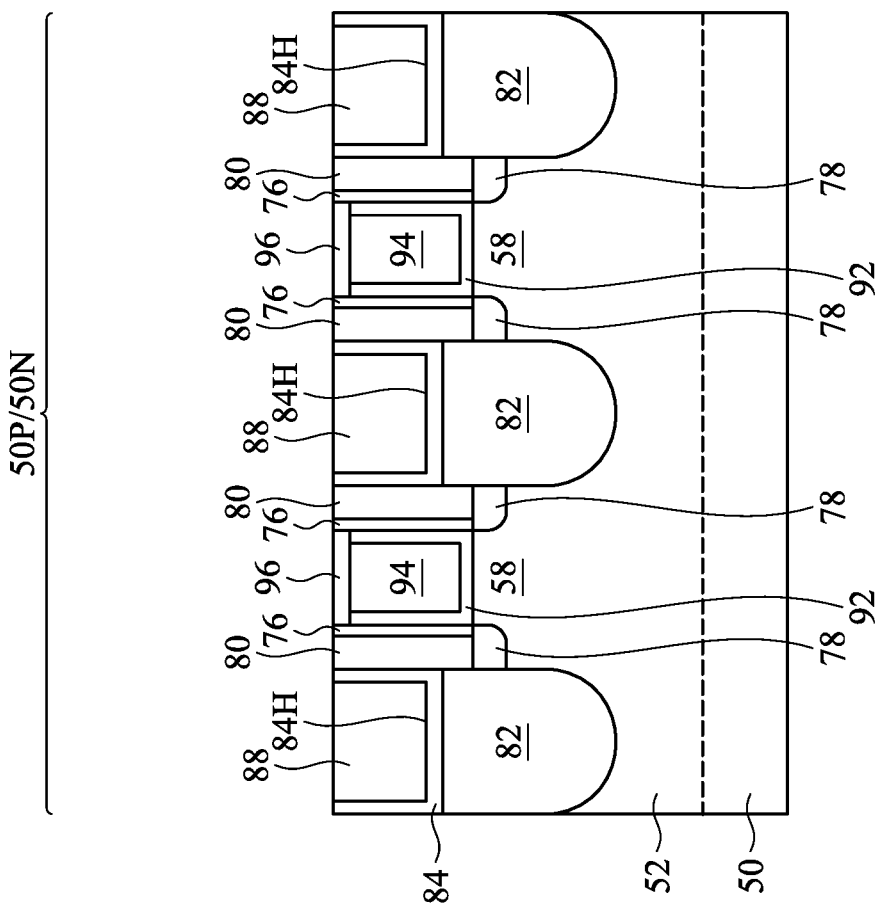

In FIGS. 19A and 19B, gate masks 96 are formed over the gate stacks. In accordance with some embodiments, the gate stacks are recessed so that a recess is formed directly over each gate stack, e.g., between opposing portions of the gate spacers 80. One or more layers of dielectric material, such as silicon nitride, silicon oxynitride, or the like, are filled in the recesses. A planarization process is performed to remove excess portions of the dielectric material extending over the first ILD 88. Remaining portions of the dielectric material in the recesses form the gate masks 96. Subsequently formed gate contacts will penetrate through the gate masks 96 to contact the top surface of the recessed gate electrode 94.

Figures 20A, 20B:
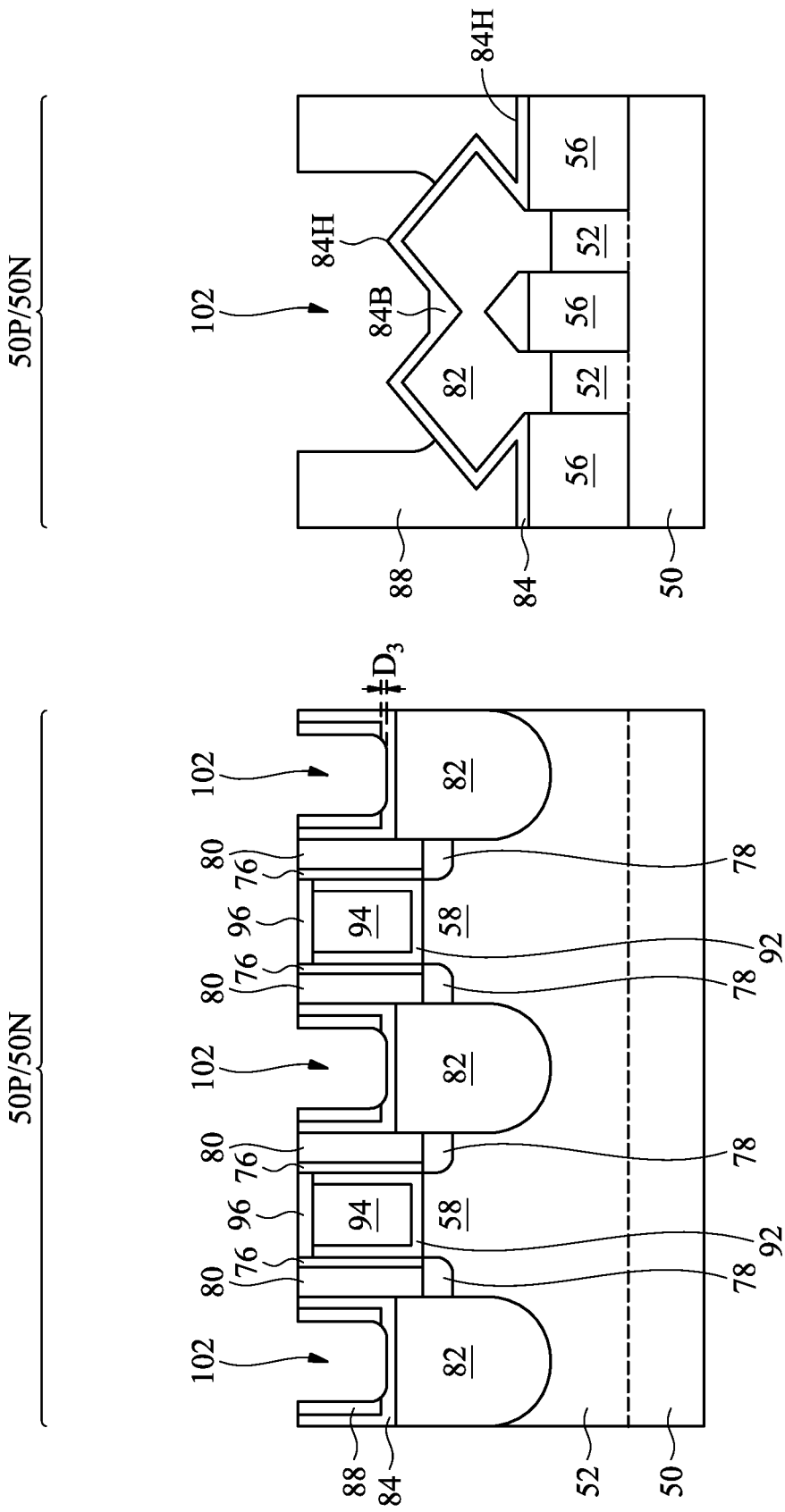

In FIGS. 20A and 20B, source/drain contact openings 102 are formed through the first ILD 88. The openings may be formed using acceptable photolithography and etching techniques. The differential CESL 84 has a high etch selectivity with the first ILD 88, and stops the etching of the source/drain contact openings 102. Recesses may be formed in the differential CESL 84 by the etching, but the recesses do not extend completed through the differential CESL 84. The recesses have a depth $D_3$, which may be less than about 3 nm. Openings exposing the epitaxial source/drain regions 82 will be subsequently formed in the differential CESL 84, but some intermediate steps are performed before the differential CESL 84 is opened.

Figure 21B:
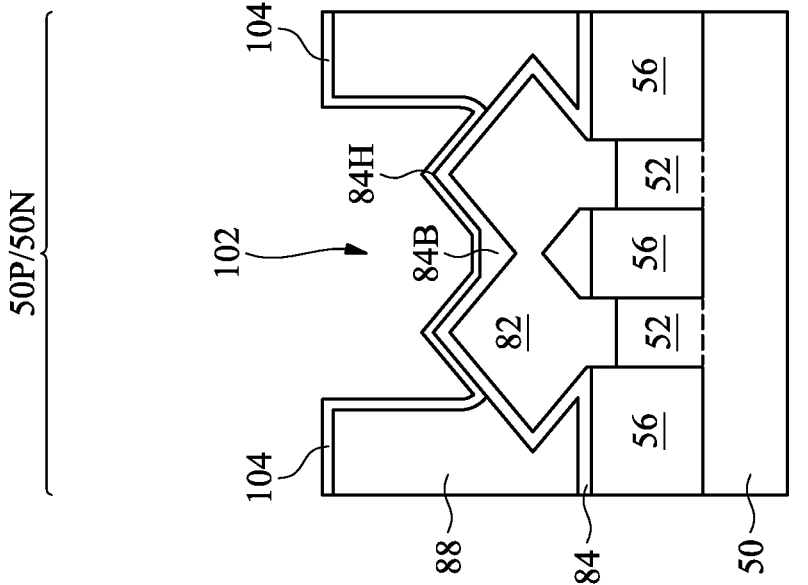
Figure 21A:
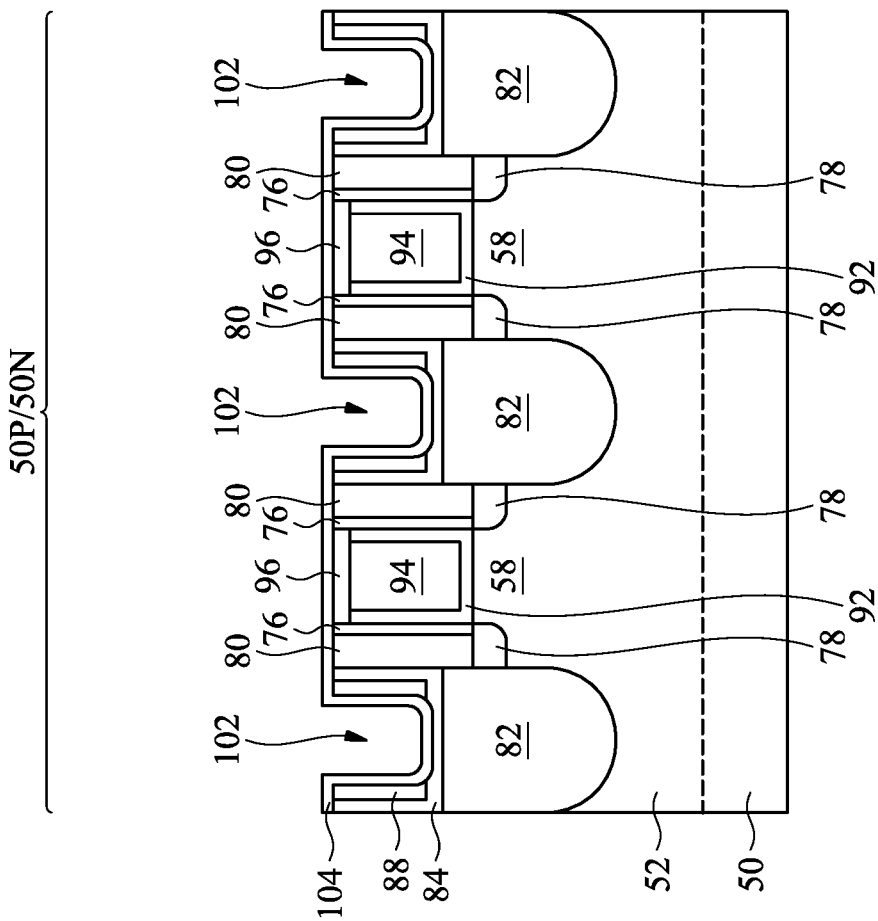

In FIGS. 21A and 21B, a contact spacer layer 104 is formed over the intermediate structure and in the source/drain contact openings 102. The contact spacer layer 104 is over the differential CESL 84, and notably, fills any recesses formed in the differential CESL 84 during the etching of the source/drain contact openings 102. The contact spacer layer 104 may be formed from a dielectric material such as silicon nitride, silicon oxynitride, aluminum oxide, or the like. In some embodiments, the differential CESL 84 and contact spacer layer 104 are formed from the same dielectric material, such as silicon nitride. The contact spacer layer 104 may be formed by a deposition process such as ALD.

Figures 22A, 22B:
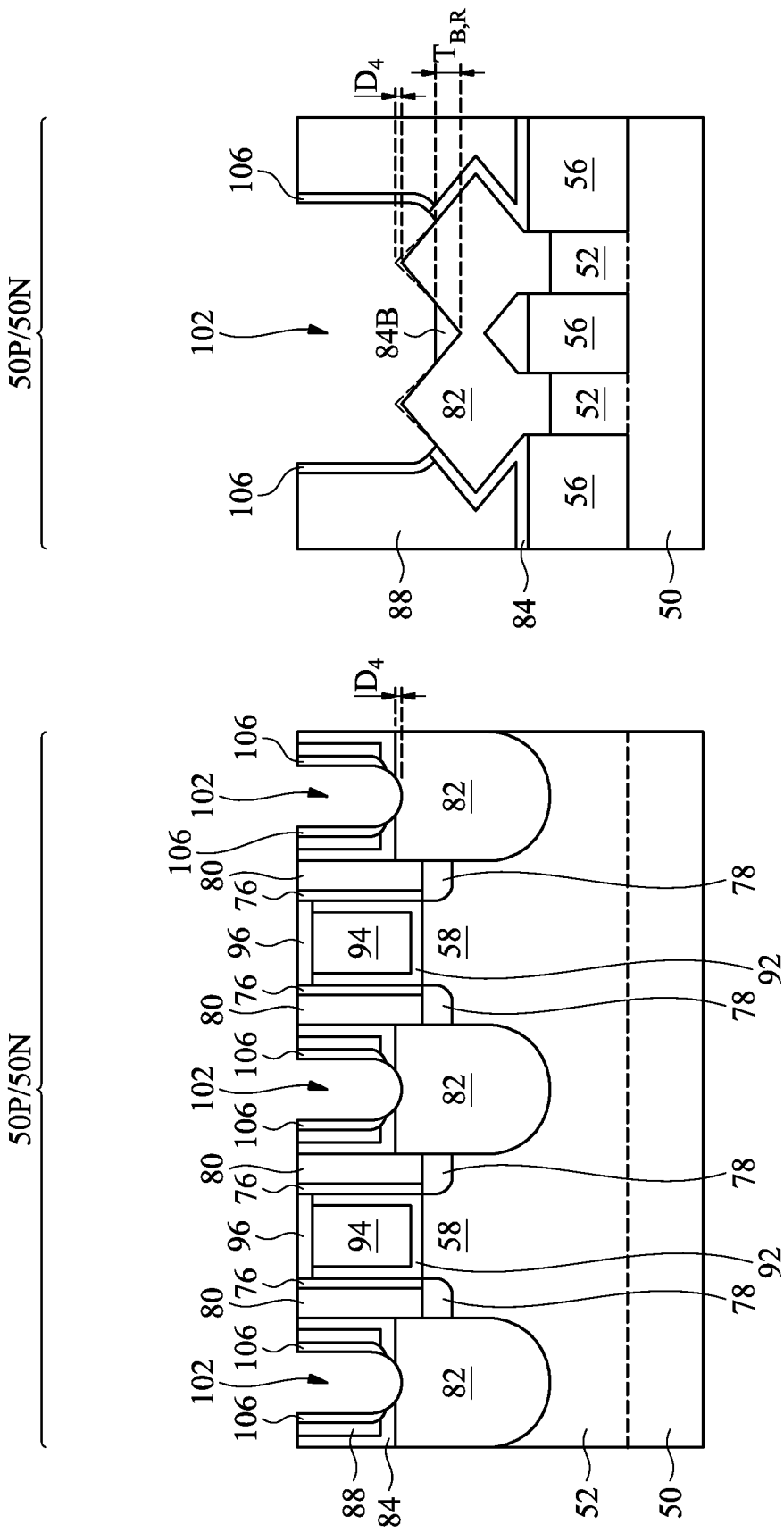

In FIGS. 22A and 22B, an etching process is performed to remove horizontal portions of the contact spacer layer 104, leaving remaining vertical portions of the contact spacer layer 104 in the source/drain contact openings 102. The etching may be by a wet or dry etch. The remaining vertical portions of the contact spacer layer 104 are contact spacers 106 that act as an additional barrier layer for subsequently formed source/drain contacts. The contact spacers 106 also protect the first ILD 88 during subsequent processing (discussed further below).

Further, the differential CESL 84 is opened, exposing the epitaxial source/drain regions 82. In embodiments where the differential CESL 84 and contact spacer layer 104 are formed from the same dielectric material, the etching process for removing the horizontal portions of the contact spacer layer 104 may be continued to extend the source/drain contact openings 102 through the differential CESL 84. In other embodiments, a separate etching process may be performed to extend the source/drain contact openings 102 through the differential CESL 84. In yet other embodiments, a combination of etching processes may be used, e.g., the etching process for removing the horizontal portions of the contact spacer layer 104 may be continued to extend the source/drain contact openings 102 partially through the differential CESL 84, and another etching process may be performed to finish extending the source/drain contact openings 102 through the differential CESL 84.

When extending the source/drain contact openings 102 through the differential CESL 84, some etching of the epitaxial source/drain regions 82 occurs. The source/drain contact openings 102 may thus extend into the epitaxial source/drain regions 82 by a distance $D_4$. Because the thickness $T_H$ of the horizontal portions 84H of the differential CESL 84 is large, the amount of etching of the epitaxial source/drain regions 82 may be reduced, and so the distance $D_4$ may be small. In some embodiments, the distance $D_4$ is less than about 3 nm. In other words, the amount of height loss suffered by the epitaxial source/drain regions 82 during the etching may be reduced. Further, after the differential CESL 84 is opened, the basin portions 84B of the differential CESL 84 may remain. The basin portions 84B remain because they have a greater thickness than the horizontal portions 84H of the differential CESL 84, and so may not be completely removed by the etching process(es) for opening the differential CESL 84. The thickness of the basin portions 84B is reduced to a thickness $T_{B,R}$ after the differential CESL 84 is opened. In some embodiments, the reduced thickness $T_{B,R}$ can be in the range of from about 6 nm to about 7.5 nm.

Figure 23B:
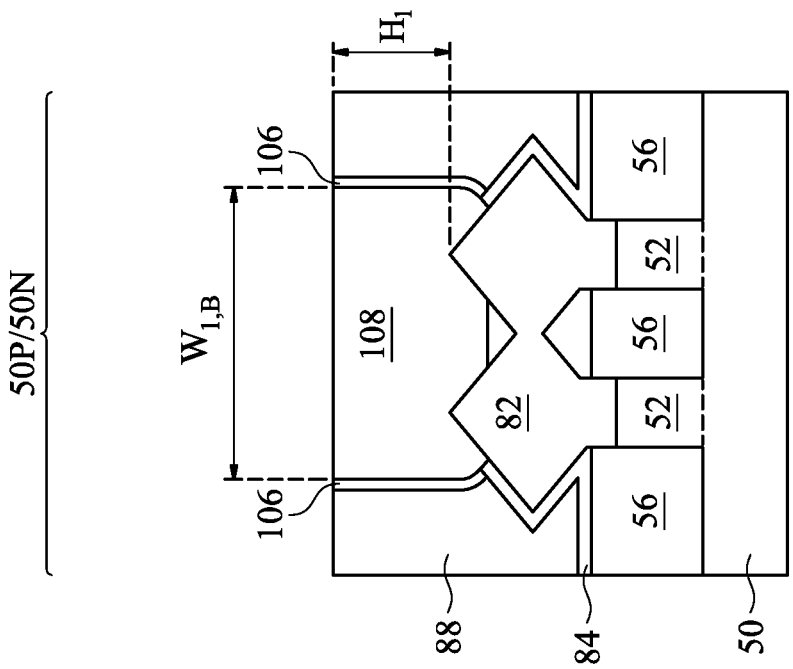
Figure 23A:
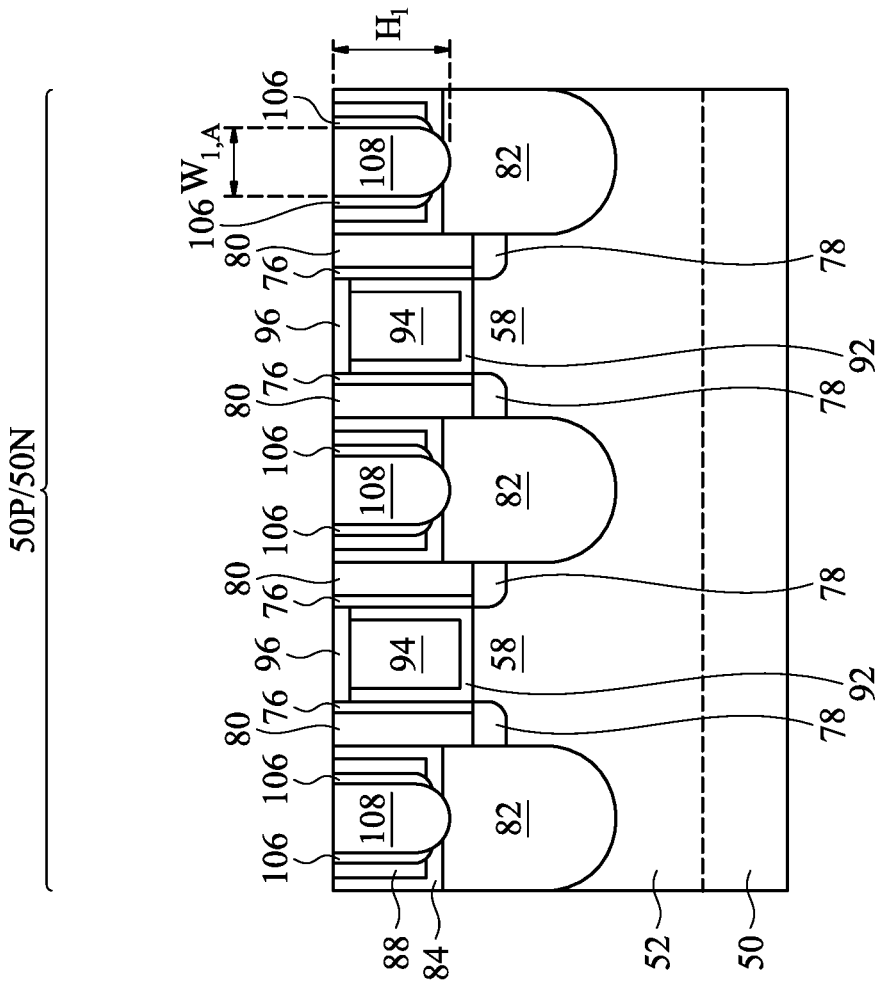

In FIGS. 23A and 23B, first source/drain contacts 108 are formed in the source/drain contact openings 102. Silicides may be formed on each of the epitaxial source/drain regions 82. The silicides may be formed by depositing a conductive material such as titanium, cobalt, or nickel in the source/drain contact openings 102, and performing an anneal. The contact spacers 106 physically separate the conductive material from the first ILD 88, protecting the first ILD 88 during the anneal process, thereby reducing consumption of the first ILD 88. The silicides are physically and electrically coupled to the epitaxial source/drain regions 82. A liner, such as a diffusion barrier layer, an adhesion layer, or the like, and a conductive material are formed in the source/drain contact openings 102. The liner may include titanium, titanium nitride, tantalum, tantalum nitride, or the like, and is formed along the contact spacers 106. The conductive material may be copper, a copper alloy, silver, gold, tungsten, cobalt, aluminum, nickel, or the like. A planarization process, such as a CMP, may be performed to remove excess material from the top surface of the first ILD 88. The remaining liner and conductive material form the first source/drain contacts 108. Notably, the first source/drain contacts 108 physically couple the remaining basin portions 84B of the differential CESL 84. After the first source/drain contacts 108 are formed, upper portions of the first source/drain contacts 108 are surrounded by the contact spacers 106, and lower portions of the first source/drain contacts 108 are surrounded by the differential CESL 84. The first source/drain contacts 108 are formed to a height $H_1$, which can be in the range of from about 8 nm to about 20 nm. The first source/drain contacts 108 are formed to a width $W_{1,A}$ along cross-section A-A (see FIG. 1), which can be in the range of from about 3 nm to about 17 nm, and are formed to a width $W_{1,B}$ along cross-section B-B (see FIG. 1), which can be in the range of from about 28 nm to about 300 nm. The width $W_{1,B}$ may be greater than the width $W_{1,A}$.

Figure 24B:
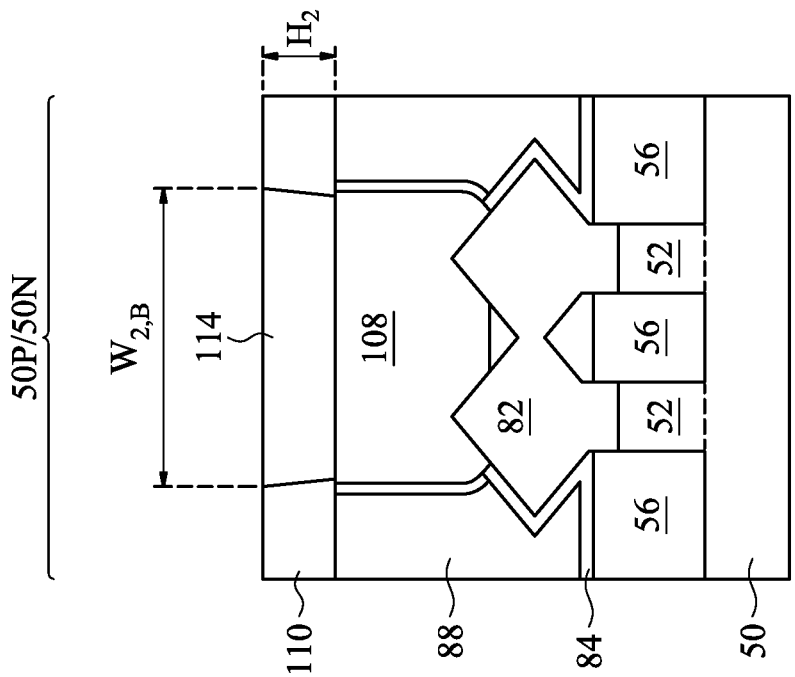
Figure 24A:
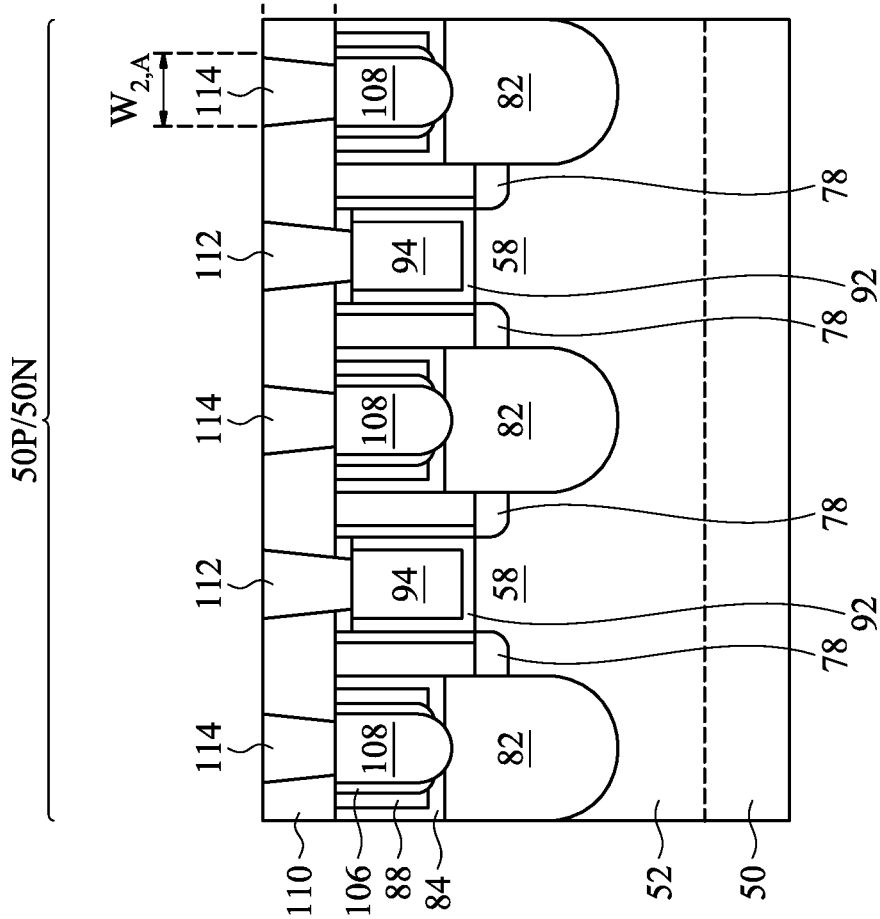

In FIGS. 24A and 24B, a second ILD 110 is deposited over the first ILD 88, gate masks 96, and first source/drain contacts 108. In some embodiment, the second ILD 110 is a flowable film formed by a flowable CVD method. In some embodiments, the second ILD 110 is formed of a dielectric material such as PSG, BSG, BPSG, USG, or the like, and may be deposited by any suitable method, such as CVD and PECVD.

Further, gate contacts 112 and second source/drain contacts 114 are formed through the second ILD 110 and the first ILD 88 in accordance with some embodiments. Openings for the second source/drain contacts 114 are formed through the second ILD 110, and openings for the gate contacts 112 are formed through the second ILD 110 and the gate masks 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 110. The remaining liner and conductive material forms the gate contacts 112 and second source/drain contacts 114 in the openings. The gate contacts 112 are physically and electrically coupled to the gate electrodes 94, and the second source/drain contacts 114 are physically and electrically coupled to the first source/drain contacts 108. The gate contacts 112 and second source/drain contacts 114 may be formed in different processes, or may be formed in the same process. Although shown as being formed in the same cross-sections, it should be appreciated that each of the gate contacts 112 and second source/drain contacts 114 may be formed in different cross-sections, which may avoid shorting of the contacts. The second source/drain contacts 114 are formed to a height $H_2$, which can be in the range of from about 6 nm to about 30 nm. The second source/drain contacts 114 are formed to a width $W_{2,A}$ along cross-section A-A (see FIG. 1), which can be in the range of from about 6 nm to about 20 nm, and are formed to a width $W_{2,B}$ along cross-section B-B (see FIG. 1), which can be in the range of from about 6 nm to about 50 nm. The width $W_{2,B}$ may be greater than the width $W_{2,A}$.

Embodiments may achieve advantages. Performing a PEALD with the directional plasma activation 86 allows the differential CESL 84 to be formed with horizontal portions 84H having a greater thickness $T_H$ than vertical portions 84V. By forming the differential CESL 84 with horizontal portions 84H having a greater thickness $T_H$, the contact spacers 106 may be formed with less etching of the epitaxial source/drain regions 82. Height loss of the epitaxial source/drain regions 82 may thus be reduced, allowing first source/drain contacts 108 of a greater critical dimension to be formed. The parasitic capacitance between the epitaxial source/drain regions 82 and the gate electrodes 94 may also be reduced by the presence of the contact spacers 106. Further, the contact spacers 106 may protect the first ILD 88 during silicidation for the first source/drain contacts 108. Finally, the amount of first ILD 88 over the epitaxial source/drain regions 82 may be increased, thereby increasing the processing window for etching the source/drain contact openings 102.

In an embodiment, a method includes: forming a differential contact etch stop layer (CESL) having a first portion over a source/drain region and a second portion along a gate stack, the source/drain region being in a substrate, the gate stack being over the substrate proximate the source/drain region, a first thickness of the first portion being greater than a second thickness of the second portion, the forming the differential CESL including performing a directional plasma activation; depositing a first interlayer dielectric (ILD) over the differential CESL; forming a source/drain contact opening in the first ILD; forming a contact spacer along sidewalls of the source/drain contact opening; after forming the contact spacer, extending the source/drain contact opening through the differential CESL; and forming a first source/drain contact in the extended source/drain contact opening, the first source/drain contact physically and electrically coupling the source/drain region, the contact spacer physically separating the first source/drain contact from the first ILD.

In some embodiments of the method, forming the contact spacer includes: depositing a contact spacer layer in the source/drain contact opening; and removing horizontal portions of the contact spacer layer, remaining vertical portions of the contact spacer layer forming the contact spacer. In some embodiments of the method, the horizontal portions of the contact spacer layer are removed with a first etching process, and the source/drain contact opening is extended through the differential CESL with the first etching process. In some embodiments of the method, the horizontal portions of the contact spacer layer are removed with a first etching process, and the source/drain contact opening is extended through the differential CESL with a second etching process, the second etching process being different from the first etching process. In some embodiments, the method further includes: annealing the first source/drain contact to form a silicide between the first source/drain contact and the source/drain region, the contact spacer physically separating the silicide from the first ILD during annealing. In some embodiments of the method, the source/drain region has a first height before extending the source/drain contact opening through the differential CESL, and the source/drain region has a second height after extending the source/drain contact opening through the differential CESL, a difference between the first height and the second height being less than about 3 nm. In some embodiments of the method, the source/drain region has faceted upper surfaces, and the differential CESL has a third portion in a junction of the faceted upper surfaces, a third thickness of the third portion greater than the first thickness and the second thickness. In some embodiments of the method, forming the first source/drain contact includes forming the first source/drain contact on the third portion of the differential CESL. In some embodiments of the method, forming the differential CESL includes: depositing silicon nitride over the source/drain region and along the gate stack with a plasma-enhanced atomic layer deposition process, the plasma-enhanced atomic layer deposition process having a first deposition rate over the source/drain region and a second deposition rate along the gate stack, the first deposition rate being greater than the second deposition rate. In some embodiments of the method, forming the differential CESL includes: exposing, in a first exposure, a surface of the source/drain region to a first precursor; after the first exposure, activating the surface of the source/drain region with the directional plasma activation; and after activating the surface of the source/drain region, exposing, in a second exposure, the activated surface of the source/drain region to a second precursor.

In an embodiment, a method includes: forming a gate spacer over a substrate; forming a source/drain region in the substrate adjacent the gate spacer; depositing a differential contact etch stop layer (CESL) along a sidewall of the gate spacer and over the source/drain region with a plasma-enhanced atomic layer deposition process, the plasma-enhanced atomic layer deposition process having a first deposition rate over the source/drain region and a second deposition rate along the sidewall of the gate spacer, the first deposition rate being greater than the second deposition rate; depositing a first interlayer dielectric (ILD) over the differential CESL; etching a source/drain contact opening in the first ILD, the source/drain contact opening stopping at the differential CESL; forming a contact spacer along sidewalls of the source/drain contact opening; and after forming the contact spacer, forming a first source/drain contact through the differential CESL to physically couple the source/drain region.

In some embodiments of the method, the plasma-enhanced atomic layer deposition process includes: exposing, in a first exposure, a surface of the source/drain region and a surface of the gate spacer to a first precursor; after the first exposure, activating the surface of the source/drain region with the directional plasma activation, the surface of the gate spacer remaining non-activated; and after activating the surface of the source/drain region and the surface of the gate spacer, exposing, in a second exposure, the activated surface of the source/drain region and the non-activated surface of the gate spacer to a second precursor. In some embodiments of the method, during the second exposure, more reactions occur at the activated surface of the source/drain region than at the non-activated surface of the gate spacer. In some embodiments of the method, the first precursor is dichlorosilane, and the second precursor is ammonia. In some embodiments of the method, activating the surface of the source/drain region includes: generating an argon directional plasma towards horizontal surfaces of the source/drain region, the argon directional plasma being generated at a pressure of less than 5 Torr. In some embodiments of the method, after the plasma-enhanced atomic layer deposition process, a thickness of the differential CESL over the source/drain region is at least 2 nm greater than a thickness of the differential CESL along the gate spacer.

In an embodiment, a device includes: a first fin extending from a substrate; a source/drain region in the first fin; a gate stack adjacent the source/drain region and over the first fin; a differential contact etch stop layer (CESL) having a first portion along the gate stack and having a second portion over the source/drain region, a first thickness of the first portion being less than a second thickness of the second portion; a first interlayer dielectric (ILD) over the differential CESL; a contact spacer extending through the first ILD and only partially through the differential CESL; and a source/drain contact extending through the first ILD and completely through the differential CESL.

In some embodiments of the device, an upper portion of the source/drain contact is surrounded by the contact spacer, and a lower portion of the source/drain contact is surrounded by the differential CESL. In some embodiments of the device, the second thickness of the second portion is at least 2 nm less than the first thickness of the first portion. In some embodiments, the device further includes: a second fin extending from the substrate, the source/drain region being in the second fin, where the source/drain region has faceted upper surfaces, the differential CESL having a third portion in a junction of the faceted upper surfaces, the third portion of the differential CESL being disposed between the source/drain region and the source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first fin extending from a substrate;
a gate stack over the first fin;
a source/drain region adjacent the gate stack;
an interlayer dielectric (ILD) over the source/drain region;
a contact etch stop layer (CESL) having a horizontal portion and a vertical portion, the horizontal portion disposed between the ILD and the source/drain region, the vertical portion disposed between the ILD and the gate stack, a first thickness of the horizontal portion being greater than a second thickness of the vertical portion;
a source/drain contact extending through the horizontal portion of the CESL, the source/drain contact connected to the source/drain region; and
a contact spacer around the source/drain contact, a portion of the contact spacer disposed between the source/drain contact and the horizontal portion of the CESL.

2. The device of claim 1, wherein the source/drain contact extends through the CESL, and the contact spacer extends partially into the CESL.

3. The device of claim 1, wherein the source/drain contact extends partially into the source/drain region.

4. The device of claim 1, wherein the contact spacer and the CESL comprise the same dielectric material.

5. The device of claim 1 further comprising:
a second fin extending from the substrate,
wherein the gate stack is over the second fin, and
wherein the source/drain region has faceted upper surfaces, the CESL having a basin portion in a junction of the faceted upper surfaces, the basin portion disposed between the source/drain region and the source/drain contact, a third thickness of the basin portion being greater than the first thickness and the second thickness.

6. The device of claim 5, wherein the third thickness is at least 0.5 nm greater than the first thickness.

7. The device of claim 1, wherein the first thickness is at least 2 nm greater than the second thickness.

8. A device comprising:
a gate spacer on a substrate;
a source/drain region adjacent the gate spacer;
a contact etch stop layer (CESL) having a first portion on a top surface of the source/drain region and having a second portion on a sidewall of the gate spacer, a first thickness of the first portion being greater than a second thickness of the second portion;
an interlayer dielectric (ILD) on the CESL;
a source/drain contact extending through the ILD and the CESL, the source/drain contact connected to the source/drain region; and a contact spacer around the source/drain contact, the contact spacer separated from the source/drain region by the CESL.

9. The device of claim 8, wherein a ratio of the first thickness to the second thickness is at least 1.1.

10. The device of claim 8, wherein the contact spacer and the CESL each comprise silicon nitride.

11. The device of claim 8 further comprising:
a channel region; and
a gate stack on the channel region, the gate spacer disposed between the source/drain region and the gate stack.

12. The device of claim 11, wherein the substrate comprises a fin, the fin comprising the channel region.

13. A method comprising:
forming a gate stack on a channel region;
forming a gate spacer adjacent the gate stack;
forming a source/drain region adjacent the gate spacer;
depositing a contact etch stop layer (CESL) on a top surface of the source/drain region and along a sidewall of the gate spacer with a deposition process, the deposition process having a first deposition rate on the top surface of the source/drain region and a second deposition rate along the sidewall of the gate spacer, the first deposition rate being greater than the second deposition rate;
depositing an interlayer dielectric (ILD) on the CESL;
forming a contact opening in the ILD;
forming a contact spacer in the contact opening;
after forming the contact spacer, extending the contact opening through the CESL; and
forming a source/drain contact in the contact opening, the source/drain contact connected to the source/drain region, the contact spacer disposed around the source/drain contact.

14. The method of claim 13, wherein the deposition process is a plasma-enhanced chemical vapor deposition process.

15. The method of claim 13, wherein the deposition process is a plasma-enhanced atomic layer deposition process.

16. The method of claim 13, wherein the deposition process comprises:
performing a directional plasma activation, the directional plasma activation increasing the first deposition rate, the directional plasma activation not increasing the second deposition rate.

17. The method of claim 13, wherein the deposition process comprises:
exposing the top surface of the source/drain region and the sidewall of the gate spacer to a first precursor and a second precursor.

18. The method of claim 17, wherein the deposition process is performed at a pressure of less than 5 Torr.

19. The method of claim 17, wherein the first precursor is dichlorosilane, and the second precursor is ammonia.

20. The method of claim 13, wherein forming the contact spacer comprises:
depositing a dielectric layer in the contact opening; and
patterning the dielectric layer with a first etching process to form the contact spacer,
wherein extending the contact opening through the CESL comprises continuing the first etching process to etch the CESL.

* * * * *